United States Patent
Takasugi

(10) Patent No.: US 8,427,405 B2
(45) Date of Patent: Apr. 23, 2013

(54) IMAGE DISPLAY DEVICE AND METHOD OF DRIVING THE SAME

(75) Inventor: Shinji Takasugi, Kanagawa (JP)

(73) Assignee: LG Display Co., Ltd., Seoul (KR)

( * ) Notice: Subject to any disclaimer, the term of this patent is extended or adjusted under 35 U.S.C. 154(b) by 729 days.

(21) Appl. No.: 12/525,052

(22) PCT Filed: Jan. 9, 2008

(86) PCT No.: PCT/JP2008/050148
§ 371 (c)(1),
(2), (4) Date: Jul. 29, 2009

(87) PCT Pub. No.: WO2008/093519
PCT Pub. Date: Aug. 7, 2008

(65) Prior Publication Data
US 2010/0020065 A1    Jan. 28, 2010

(30) Foreign Application Priority Data

Jan. 30, 2007 (JP) ................................ 2007-019507
Oct. 31, 2007 (JP) ................................ 2007-284053

(51) Int. Cl.
G09G 3/32 (2006.01)
(52) U.S. Cl.
USPC .......................................................... 345/82
(58) Field of Classification Search .................... 345/84, 345/211, 214, 76, 82–83; 315/169.1
See application file for complete search history.

(56) References Cited

U.S. PATENT DOCUMENTS

| | | | |
|---|---|---|---|
| 2003/0151577 A1* | 8/2003 | Morita | 345/89 |
| 2004/0100203 A1* | 5/2004 | Kobayashi et al. | 315/169.3 |
| 2004/0183483 A1 | 9/2004 | Inoue et al. | |
| 2005/0110786 A1 | 5/2005 | Inoue et al. | |
| 2006/0022969 A1* | 2/2006 | Lee et al. | 345/211 |

FOREIGN PATENT DOCUMENTS

| | | |
|---|---|---|
| JP | 2003-280590 A | 10/2003 |
| JP | 2004-170815 A | 6/2004 |
| JP | 2005-107059 A | 4/2005 |
| JP | 2006-309258 A | 11/2006 |
| WO | WO-03/027999 A1 | 4/2003 |
| WO | WO-2004/114273 A1 | 12/2004 |
| WO | WO-2005/122120 A2 | 12/2005 |

OTHER PUBLICATIONS

Ono, S. et al., Proceedings of IDW '03, pp. 255-258 (2003).

* cited by examiner

Primary Examiner — Chanh Nguyen
Assistant Examiner — Pegeman Karimi
(74) Attorney, Agent, or Firm — Birch, Stewart, Kolasch & Birch, LLP

(57) ABSTRACT

Discussed is a method of driving an image display device including a plurality of pixel circuits having respective light emitting elements and arranged in a plane in a first direction and in a second direction different from the first direction; and a plurality of power source lines each connected in common to each column of pixel circuits which comprises the pixel circuits arranged in the first direction comprises (a) deriving a voltage drop expected to be generated in one power source line based on the wiring resistance of the one power source line and first image data supplied to a plurality of pixel circuits connected in common to the one power source line; (b) deriving second image data by correcting the first image data based on the voltage drop; and (c) causing the light emitting elements to emit light based on the second image data.

7 Claims, 23 Drawing Sheets

F I G. 4
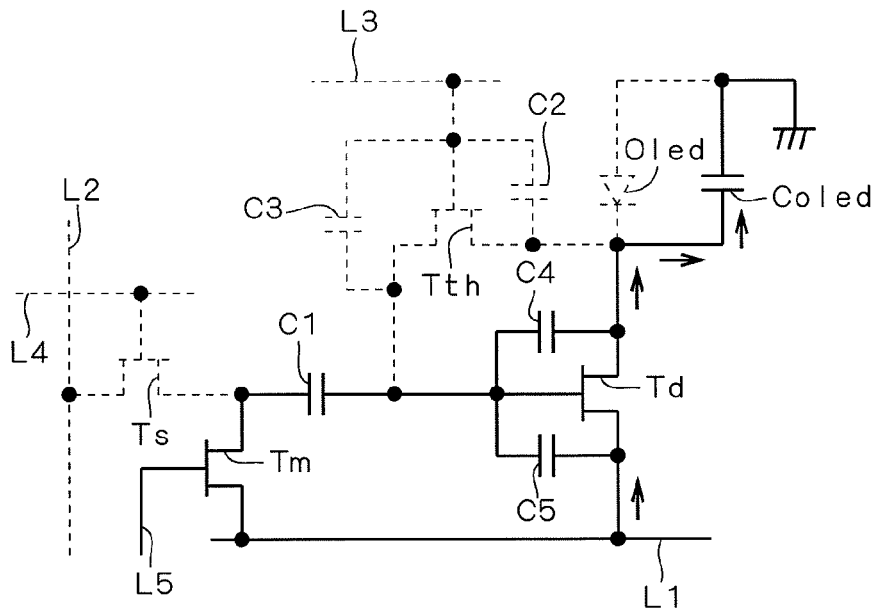
F I G. 5
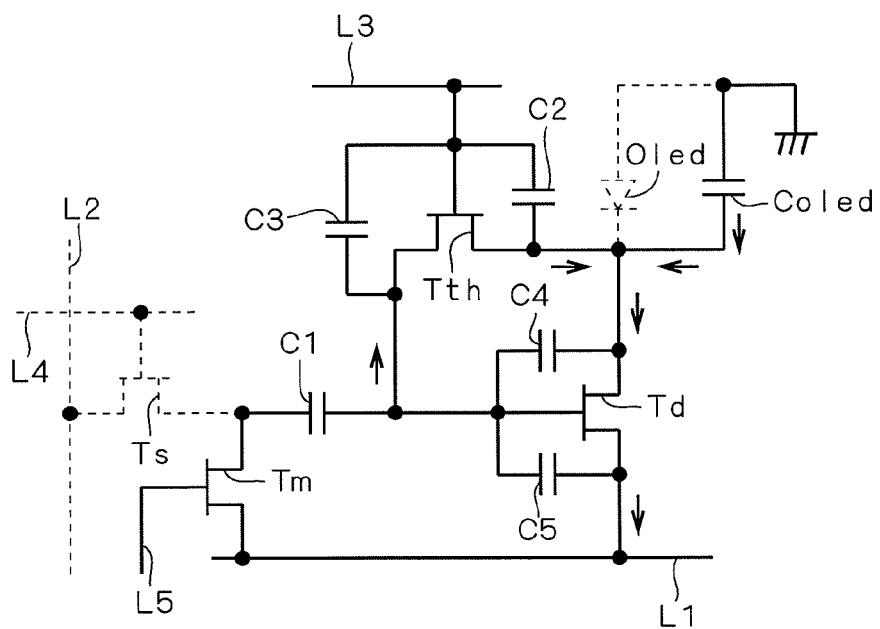

F I G. 1 1
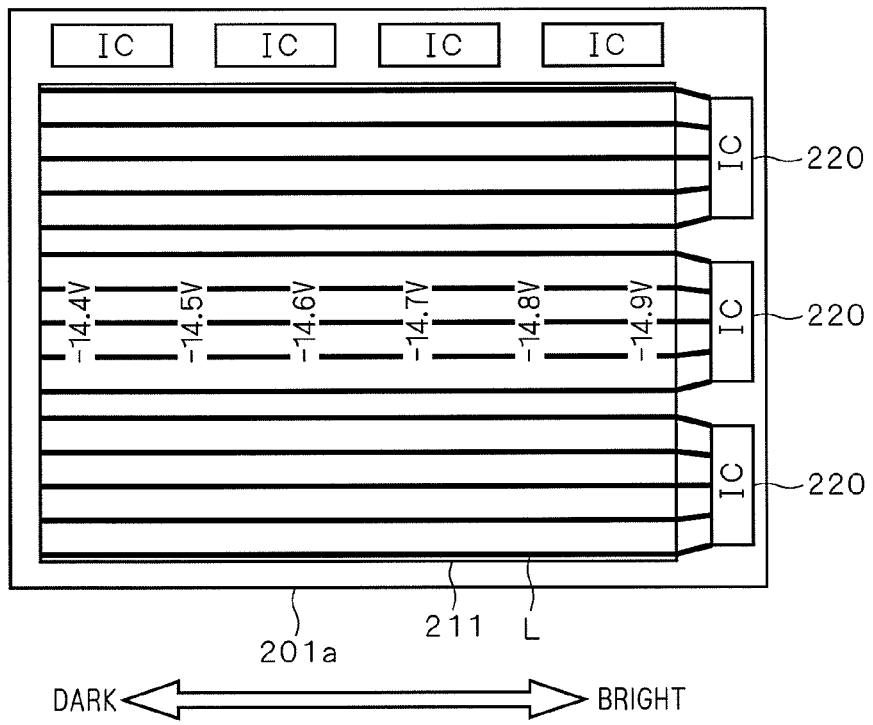
F I G. 1 2
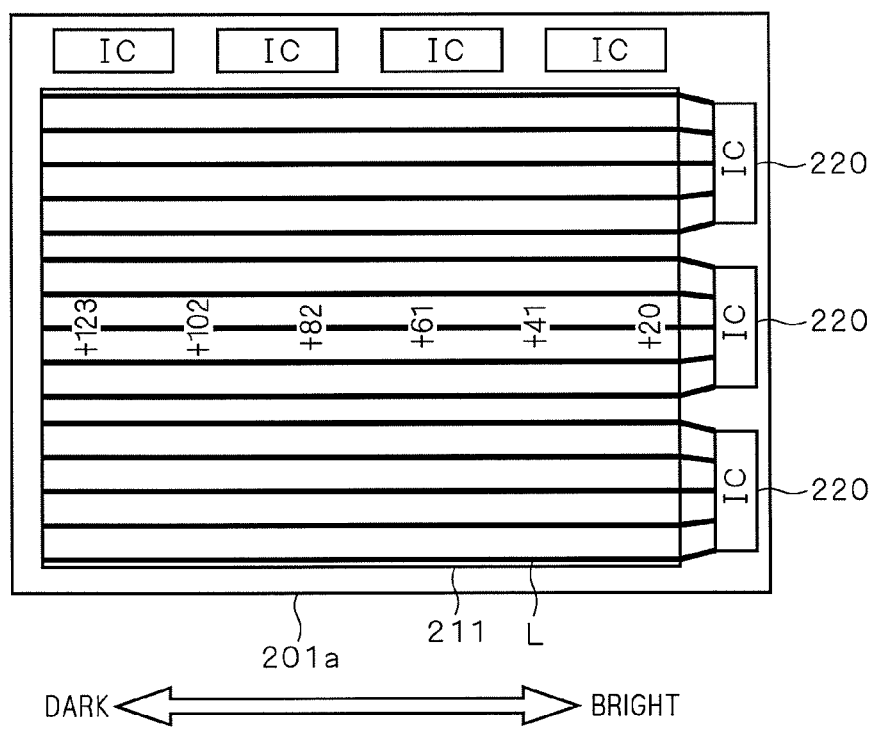

IMAGE DISPLAY DEVICE AND METHOD OF DRIVING THE SAME

TECHNICAL FIELD

The present invention relates to an image display device and a method of driving the same, namely to a technique of displaying an image.

BACKGROUND ART

In a widely known active matrix type image display device, each pixel has a TFT (thin film transistor) made of amorphous Si, polycrystalline Si and the like, and a current control light emitting element such as an OLED (organic light emitting diode). In this image display device, different current values can be set for each pixel in response to image data to be displayed, thereby changing brightness level of each pixel.

A current Ids flowing between the source and the drain of a TFT when a light emitting element is caused to emit light is in proportion to the square of the potential difference between the source and the gate with respect to a source potential, namely the difference between a gate voltage Vgs and a threshold voltage Vth specified to the TFT. The brightness level of an OLED is substantially in proportion to the current density of a current flowing in the OLED, namely the current Ids.

A conventional image display device is disclosed for example in patent document (Japanese Patent Application Laid-Open No. 2006-309258), non-patent document (S. Ono et al., Proceedings of IDW '03, 255 (2003)), and others.

In the image display device discussed above, a plurality of pixel circuits having respective light emitting elements are arranged in a matrix. Further, a power source line is connected in common to pixel circuits for each row, or is connected in common to all pixel circuits. The power source line has wiring resistance. Thus, a potential applied from the power source line to each pixel circuit may change based on the wiring resistance and a flowing current. As a result, in a structure in which a plurality of pixel circuits are connected in common to an IC for supplying a negative power source potential through one power source line, for example, the power source potential to be supplied becomes higher (the absolute value of the negative potential becomes smaller) as a distance from the IC to a pixel circuit becomes longer. In a structure in which a plurality of pixel circuits are connected in common on a row-to-row basis to an IC for supplying a negative power source potential through one power source line, for example, the power source potential to be supplied becomes higher (the absolute value of the negative potential becomes smaller) as a distance from the IC to a pixel circuit becomes longer.

A source potential applied to a TFT, namely an NMOS transistor becomes higher in a pixel circuit as a power source potential to be supplied becomes higher, thereby lowering the gate voltage Vgs while reducing the current Ids flowing between the drain and the source. Namely, in a plurality of pixel circuits, when a power source potential to be supplied varies among the pixel circuits, the brightness level of an OLED which is in proportion to the current density of the current Ids also varies. This may generate trouble of irregularity in brightness level in an image to be displayed, so deterioration of image quality may occur. In a plurality of pixel circuits connected in common in the same row, when a power source potential to be supplied varies among the pixel circuits, the brightness level of an OLED which is in proportion to the current density of the current Ids also varies. This may generate trouble of irregularity in brightness level, cross talk or the like in an image to be displayed, so deterioration of image quality may occur.

DISCLOSURE OF INVENTION

The present invention has been made in view of the foregoing problems. It is an object of the present invention to provide an image display device and a method of driving the same capable of improving image quality.

In order to solve the foregoing problems, a method of driving an image display device according to a first aspect of the present invention is a method of driving an image display device including a plurality of pixel circuits each having a light emitting element, and arranged in planar along a first direction and a second direction different from the first direction; and a plurality of power source lines each connected in common to each column of pixel circuits which comprises the pixel circuits arranged in the first direction. The method comprises: a first deriving step of deriving voltage drop expected to be generated in one power source line of the plurality of power source lines based on a resistance of the one power source line, and first image data supplied to the plurality of pixel circuits connected in common to the one power source line, and arranged in the first direction; a second deriving step of deriving second image data by correcting the first image data based on the voltage drop derived in the first deriving step; and a light emission step of causing the light emitting elements to emit light based on the second image data derived in the second deriving step.

An image display device according to a second aspect of the present invention comprises: a plurality of pixel circuits each having a light emitting element, and arranged in planar along a first direction and a second direction different from the first direction; and a plurality of power source lines each connected in common to the plurality of pixel circuits for each column of pixel circuits arranged along the first direction. The image display device further comprises a voltage drop deriving part for deriving voltage drop expected to be generated in one power source line of the plurality of power source lines based on a resistance of the power source line, and first image data supplied to the plurality of pixel circuits connected in common to the one power source line and arranged in the first direction. The image display device also comprises: a second image data deriving part for deriving second image data by correcting the first image data based on the voltage drop derived by the voltage drop deriving part; and a drive control part for causing the light emitting elements to emit light based on the second image data derived by the second image data deriving part.

A method of driving an image display device according to a third aspect of the present invention is a method of driving an image display device including a plurality of pixel circuits each having a light emitting element; a power source line connected in common to the plurality of pixel circuits, supplying a current from one end side toward an opposite end side of a light emission region in which the plurality of pixel circuits are arranged; and an image signal line for applying a potential corresponding to image data to the plurality of pixel circuits. The method comprises a deriving step of deriving a second correction value based on a first correction value derived from tone data of the plurality of pixel circuits included in a first light emission region extending halfway from the opposite end side to the one end side of the light emission region, a resistance of the power source line, and tone data of the plurality of pixel circuits included in a second light emission region arranged closer to the one end side than the first light emission region. The method further comprises a setting step of setting a potential of the plurality of pixel circuits arranged in the second light emission region or a potential of the plurality of pixel circuits arranged closer to the one end side than the second light emission region by applying a potential based on the image data and the second correction value to the image signal line. The method also comprises a light emission step of causing each of the light emitting elements to emit light by supplying a current from the power source line to each of the light emitting elements.

An image display device according to a fourth aspect of the present invention comprises: a plurality of pixel circuits each having a light emitting element; a power source line connected in common to the plurality of pixel circuits, and supplying a current from one end side toward an opposite end side of a light emission region in which the plurality of pixel circuits are arranged; and an image signal line for applying a potential corresponding to image data to the plurality of pixel circuits. The image display device further comprises a calculation part for deriving a second correction value based on a first correction value derived from tone data of the plurality of pixel circuits included in a first light emission region extending halfway from the opposite end side to the one end side of the light emission region, a resistance of the power source line, and tone data of the plurality of pixel circuits included in a second light emission region arranged closer to the one end side than the first light emission region. The image display device also comprises a potential application part for setting a potential of the plurality of pixel circuits arranged in the second light emission region or a potential of the plurality of pixel circuits arranged closer to the one end side than the second light emission region by applying a potential based on the image data and the second correction value to the image signal line. The image display device still further comprises a control part for causing each of the light emitting elements to emit light by supplying a current from the power source line to each of the light emitting elements.

BRIEF DESCRIPTION OF DRAWINGS

FIG. 4 is a circuit diagram showing the operation of the pixel circuit according to the first embodiment of the present invention;

FIG. 5 is a circuit diagram showing the operation of the pixel circuit according to the first embodiment of the present invention;

FIG. 11 is a schematic view showing the tone processing performed in the image display device according to the first embodiment of the present invention;

FIG. 12 is a schematic view showing the tone processing performed in the image display device according to the first embodiment of the present invention;

BEST MODE FOR CARRYING OUT THE INVENTION

<1. Explanation of Term>

"Tone" referred to in the present description is used as a parameter to indicate the luminance level of each color. As an example, in a tone expression using a certain bit (8-bit, for example), the tone of each color at a minimum (0 tone, for example) means that color is reproduced in the darkest manner, while the tone of each color at a maximum (255 tones, for example) means that color is reproduced in the brightest manner.

<2. Noteworthy Point in First Embodiment>

Figure 1:
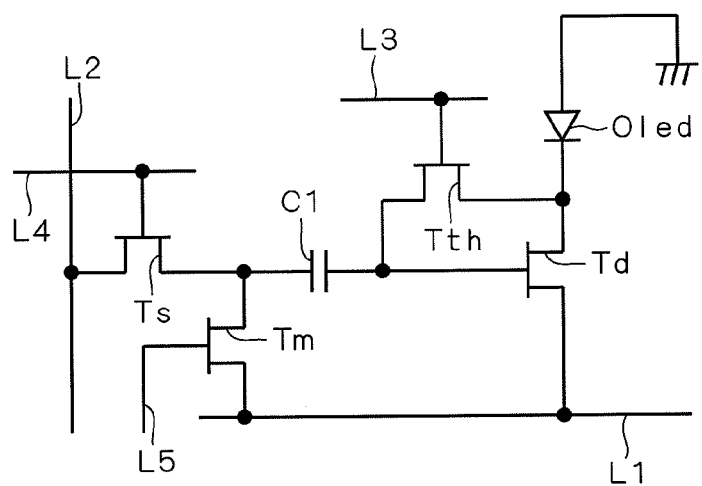
FIG. 1 is a circuit diagram showing the configuration of a pixel circuit included in an image display device according to a first embodiment of the present invention.

FIG. 1 is a circuit diagram showing the configuration of a pixel circuit included in an image display device according to a first embodiment of the present invention. Two or more of such pixel circuits are arranged in a matrix in the image display device.

In FIG. 1, a diode Oled as a light emitting element formed from an organic light emitting diode has an input terminal connected to the ground, and an output terminal connected through a driving NMOS transistor Td to a power source line L1.

Regarding the transistor Td, an NMOS transistor Tth for threshold voltage detection of a gate voltage is connected between the gate and the drain.

Regarding the NMOS transistor Td, one electrode of retention capacitance (retention capacitor) C1 is connected to the gate. The other electrode of the retention capacitor C1 is connected through an NMOS transistor Ts to an image signal line L2, and is connected through an NMOS transistor Tm to the power source line L1. Electric charge is accumulated through the NMOS transistor Tth into the retention capacitor C1, so that a potential responsive to this electric charge is reflected upon the gate potential of the NMOS transistor Td.

A Tth control line L3, a scanning line L4 and a merge line L5 are connected respectively to the gates of the NMOS transistors Tth, Ts and Tm. In the below, the power source line L1, the image signal line L2, the Tth control line L3, the scanning line L4 and the merge line L5 may also be collectively and simply referred to as lines L.

Figure 2:
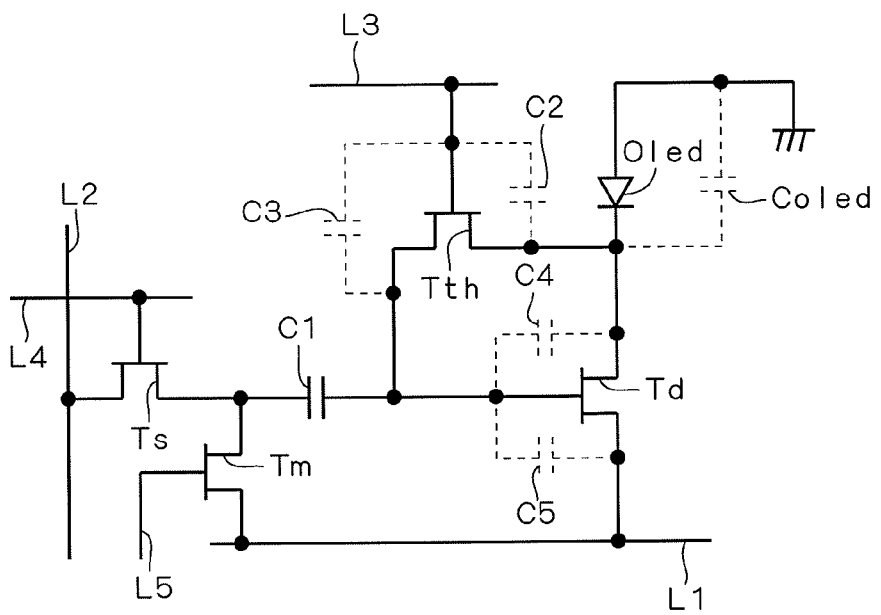
FIG. 2 is a circuit diagram showing the configuration of the pixel circuit included in the image display device according to the first embodiment of the present invention while specifying MOS transistor parasitic capacitance and OLED capacitance.

FIG. 2 specifies MOS transistor parasitic capacitance (parasitic capacitor) and OLED capacitance (OLED capacitor) in FIG. 1. As shown in FIG. 2, an OLED capacitor Coled is generated between the input and output terminals of the diode Oled during application of a reverse voltage. In the transistor Td, parasitic capacitors C4 and C5 are generated between the gate and the drain, and between the gate and the source respectively. In the transistor Tth, parasitic capacitors C2 and C3 are generated between the gate and the drain, and between the gate and the source respectively.

Figure 3:
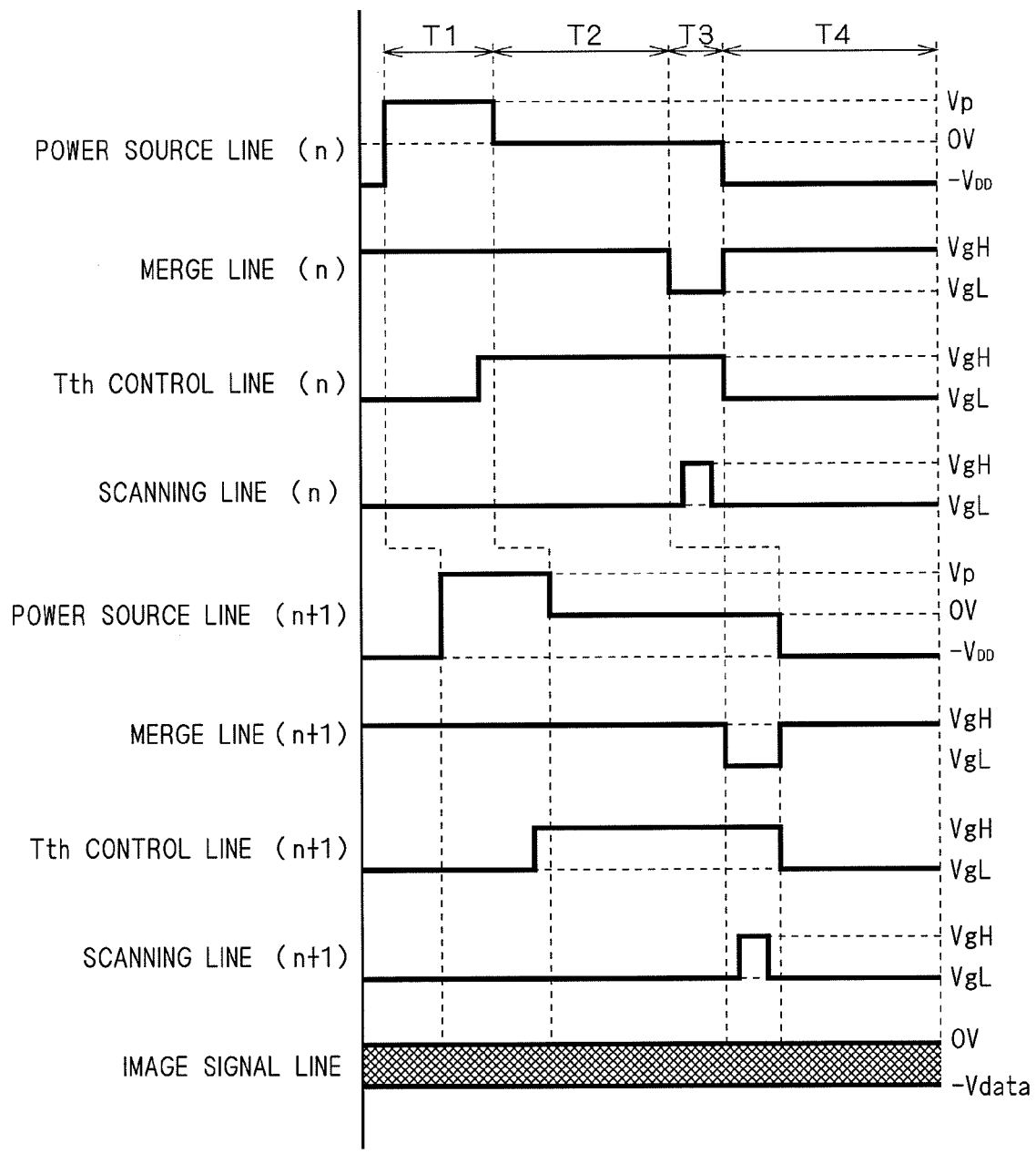
FIG. 3 is a timing chart showing the operation of the pixel circuit according to the first embodiment of the present invention.

FIG. 3 is a timing chart showing the operation of the pixel circuit shown in FIGS. 1 and 2. Potentials shown in FIG. 3 are applied from each of the lines L1 to L5 to a pixel circuit in an $n^{th}$ row (n is a natural number) and a pixel circuit in the $(n+1)^{th}$ row that are part of a plurality of pixel circuits included in the image display device (namely, potentials respectively applied to pixel circuits at two neighboring rows). As shown in FIG. 3, a unit frame period for displaying single image data includes a period T1 for preparation, a period T2 for detecting a threshold voltage Vth of the NMOS transistor Td, a period T3 for writing, and a period T4 for light emission. There is a shift between the $n^{th}$ row and the $(n+1)^{th}$ row by a period corresponding to the period T3. This unit frame period is repeated while image data is changed (namely, while the potential of the image signal line L2 is changed) to thereby display moving images.

The periods T1 to T4 of FIG. 3 are discussed next with reference to FIGS. 4 to 7. It is assumed that, at the start of the period T1, the retention capacitor C1 stores therein electric charge accumulated in the period T4 of a previous frame.

First, with reference to FIG. 4, in the period T1 of FIG. 3, the NMOS transistors Ts and Tth are cut off as gate potentials are at L level (VgL). The NMOS transistor Tm is conducting as a gate potential is at H level (VgH). Regarding the NMOS transistor Td, the gate potential (Vgs) with respect to a source potential is higher than the threshold voltage (Vth) by electric charge accumulated in the retention capacitor C1, so the NMOS transistor Td is conducting. Thus, electric charge is accumulated from the power source line L1 at a potential Vp (Vp>0) through the conducting NMOS transistor Td into the OLED capacitor Coled.

Next, with reference to FIG. 5, in the period T2 of FIG. 3, the NMOS transistor Ts is cut off as a gate potential is at L level (VgL). The NMOS transistors Tm and Tth are conducting as gate potentials are at H level (VgH). Regarding the NMOS transistor Td, the gate and the drain are connected through the conducting NMOS transistor Tth. Accordingly, electric charge accumulated in the retention capacitor C1 and the OLED capacitor Coled exits therefrom toward the power source line L1 at a potential 0 V until the gate potential of the NMOS transistor Td reaches the threshold voltage Vth. When the gate potential of the NMOS transistor Td reaches the threshold voltage Vth, the NMOS transistor Td is cut off.

Figure 6:
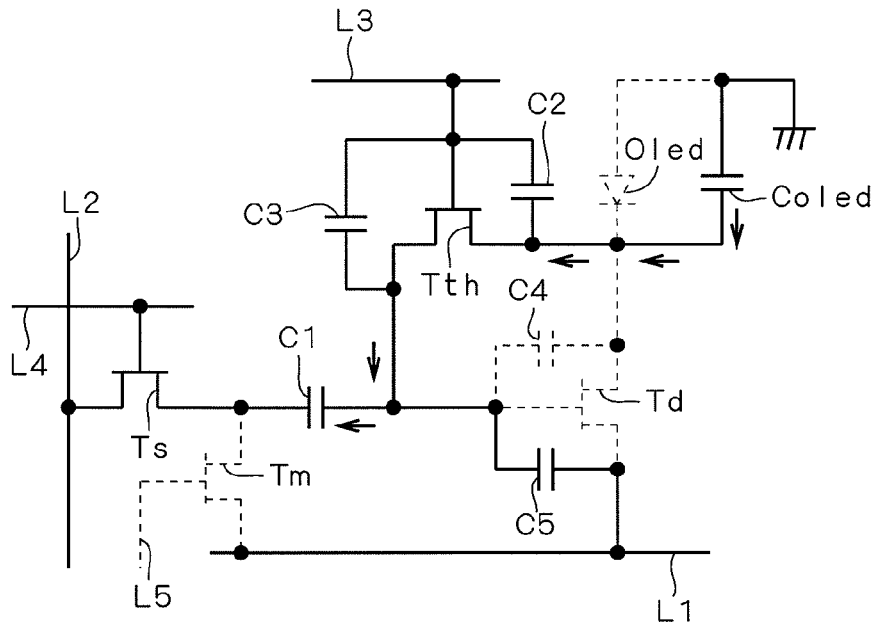
FIG. 6 is a circuit diagram showing the operation of the pixel circuit according to the first embodiment of the present invention.

Next, with reference to FIG. 6, in the period T3 of FIG. 3, the NMOS transistors Ts and Tth are conducting as gate potentials are at H level (VgH). The NMOS transistor Tm is cut off as a gate potential is at L level (VgL). Thus, the other electrode of the retention capacitor C1 is connected to the image signal line L2 at a potential (−Vdata) through the conducting NMOS transistor Ts, so electric charge accumulated in the OLED capacitor Coled moves toward the retention capacitor C1. At this time, the NMOS transistor Td is cut off.

Figure 7:
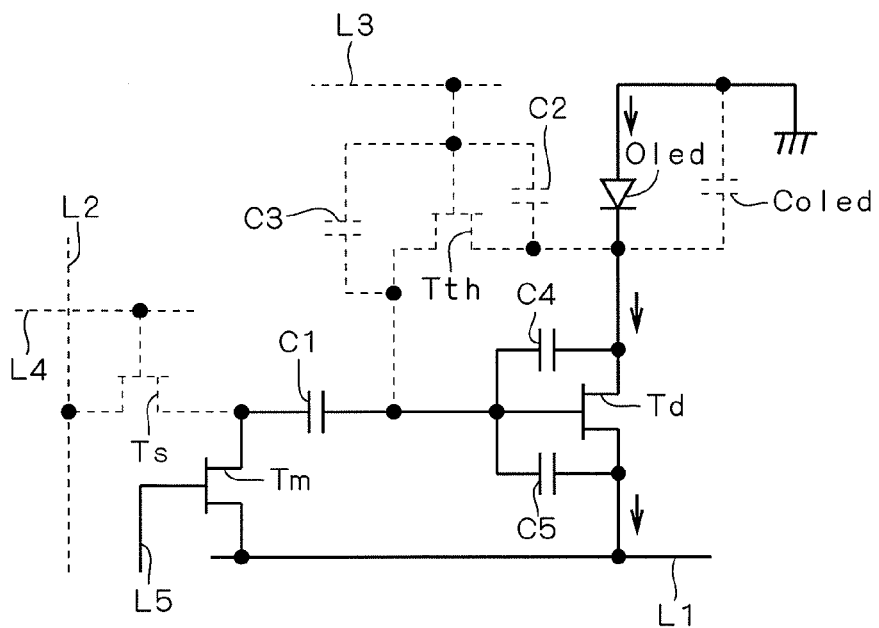
FIG. 7 is a circuit diagram showing the operation of the pixel circuit according to the first embodiment of the present invention.

Next, with reference to FIG. 7, in the period T4 of FIG. 3, the NMOS transistors Ts and Tth are cut off as gate potentials are at L level (VgL). The NMOS transistor Tm is conducting as a gate potential is at H level (VgH). The NMOS transistor Td is conducting as the gate potential Vgs with respect to a source potential is higher than the threshold voltage Vth by electric charge accumulated in the retention capacitor C1. Thus, a current flows from a grounding line through the conducting NMOS transistor Td into the power source line L1 at a negative potential (−VDD, where VDD>0 V), thereby causing the diode Oled to emit light.

In the period T4, the gate potential Vgs with respect to the source of the NMOS transistor Td (hereinafter simply referred to as Vgs) is expressed by using constants a and d as Vgs=Vth+a×Vdata+d. A current Ids flowing between the source and the drain of the NMOS transistor Td is expressed by using a constant β as Ids=(β/2) (Vgs−Vth)²=(β/2) (a×Vdata+d)². As discussed above, the brightness level of the diode Oled in the period T4 is in proportion to the current density of the current Ids. So, a desirable brightness level is obtained for each pixel circuit by controlling the image signal line L2 at a desirable potential, namely a desirable Vdata.

Figure 8:
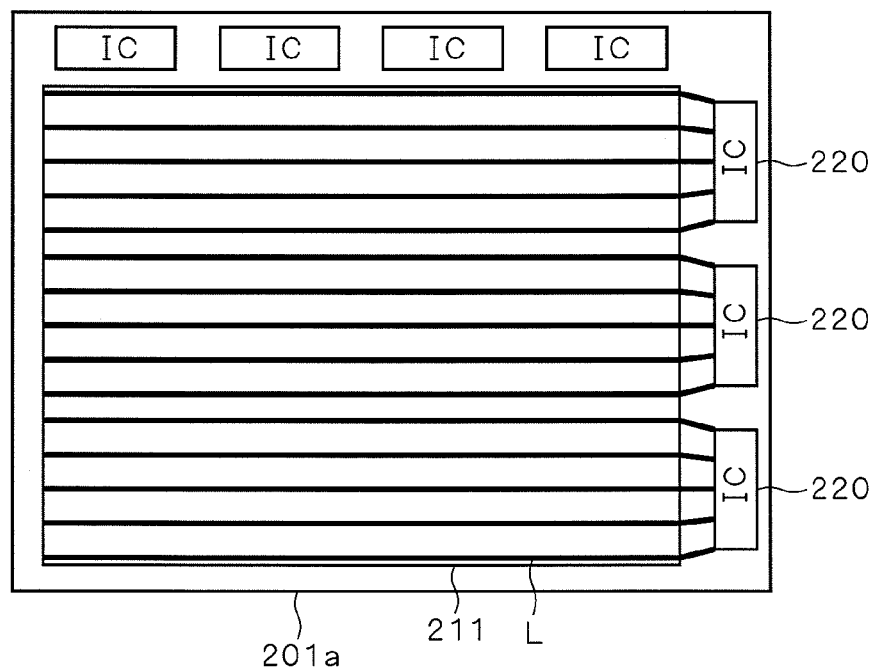
FIG. 8 is a schematic view showing the arrangement of a plurality of pixel circuits in the image display device according to the first embodiment of the present invention.

In FIG. 8, an image display device 201a includes, although not shown, a plurality of pixel circuits arranged in rows (horizontal direction in the drawing) and in columns (vertical direction in the drawing) in an image display region 211. In the image display device 201a, ICs 220 for driving pixel circuits are arranged at the right end, and are connected to each pixel circuit through each of the lines L1 to L5 (five lines are shown in FIG. 8) extending in the horizontal direction.

Figure 9:
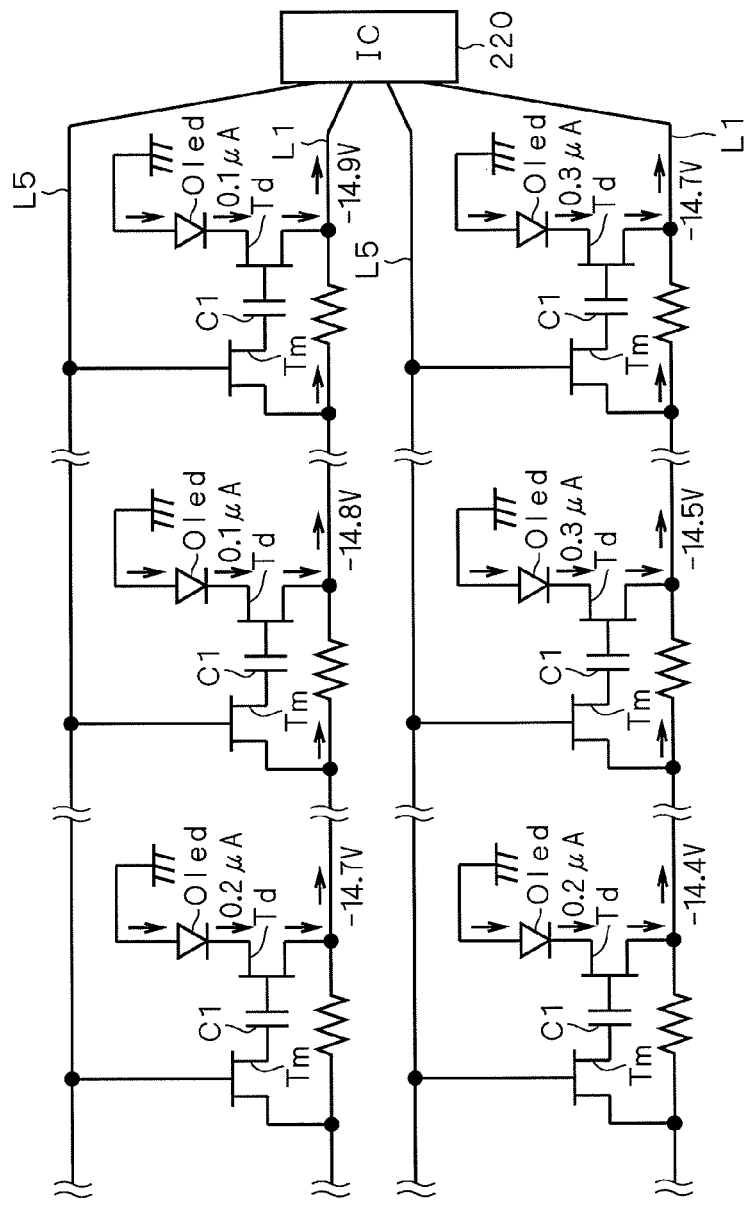
FIG. 9 is a circuit diagram showing the arrangement of a plurality of pixel circuits in the image display device according to the first embodiment of the present invention.

FIG. 9 shows connection of part of a plurality of pixel circuits (in two rows and in three columns) for constituting the image display device 201a in FIG. 8. In FIG. 9, only those elements that are directly concerned with light emission control in the period T4 are selectively shown as pixel circuits.

In FIG. 9, the power source line L1 is provided for each row (two in FIG. 9) so as to extend in the horizontal direction, and connects a plurality of pixel circuits (three in FIG. 9) to the input terminal of the IC 220 on the right for supplying a power source potential of −15 V. The power source line L1 has wiring resistance (shown as resistive elements in FIG. 9) as discussed above, so the flow of the current Ids causes voltage drop. Thus, with regard to a plurality of pixel circuits arranged in common in the same row, by a current flowing through the power source line L1, a voltage applied across a series circuit constituted by the diode Oled and the NMOS transistor Td of a pixel circuit becomes lower as a distance from the IC 220 becomes longer. In FIG. 9, voltages applied across three pixel circuits in the first row are lowered stepwise as 14.9 V, 14.8 V and 14.7 V in a direction in which the pixel circuits are spaced farther from the IC 220, as a distance from the IC 220 becomes longer. Voltages applied across three pixel circuits in the second row are lowered stepwise as 14.7 V, 14.5 V and 14.4 V in a direction in which the pixel circuits are spaced further from the IC 220.

The brightness level of each pixel circuit differs in response to image data to be displayed on the image display device 201a, so the current Ids flowing between the source and the drain of the NMOS transistor Td differs among pixel circuits. Accordingly, the amount of voltage drop generated in the power source line L1 differs among pixel circuits in response to image data to be displayed as well as the wiring resistance of the power source line L1. In FIG. 9, the currents Ids flowing through the three pixel circuits in the first row are 0.2 μA, 0.1 μA and 0.1 μA from the first column to the third column. The currents Ids flowing through the three pixel circuits in the second row are 0.2 μA, 0.3 μA and 0.3 μA from the first column to the third column.

In a plurality of pixel circuits, even when the gate potentials of the NMOS transistors Td applied from the retention capacitors C1 are the same, drain voltages Vds with respect to the sources differ as different potentials are supplied from the power source line L1. The currents Ids flowing between the sources and the drains are also different accordingly. As a result, the image display device 201a shown in FIG. 8 is bright on the right side and dark on the left side, so irregularity in brightness level is visually recognized.

In a plurality of pixel circuits, when potentials supplied from the power source line L1 are different, the gate potentials of the NMOS transistors Td differ by the influences of the parasitic capacitors C4. As a result, a cross talk (a dark band is recognized in the horizontal direction in a white image) in the horizontal direction in the drawing is visually recognized.

<3. First Embodiment>

Figure 10:
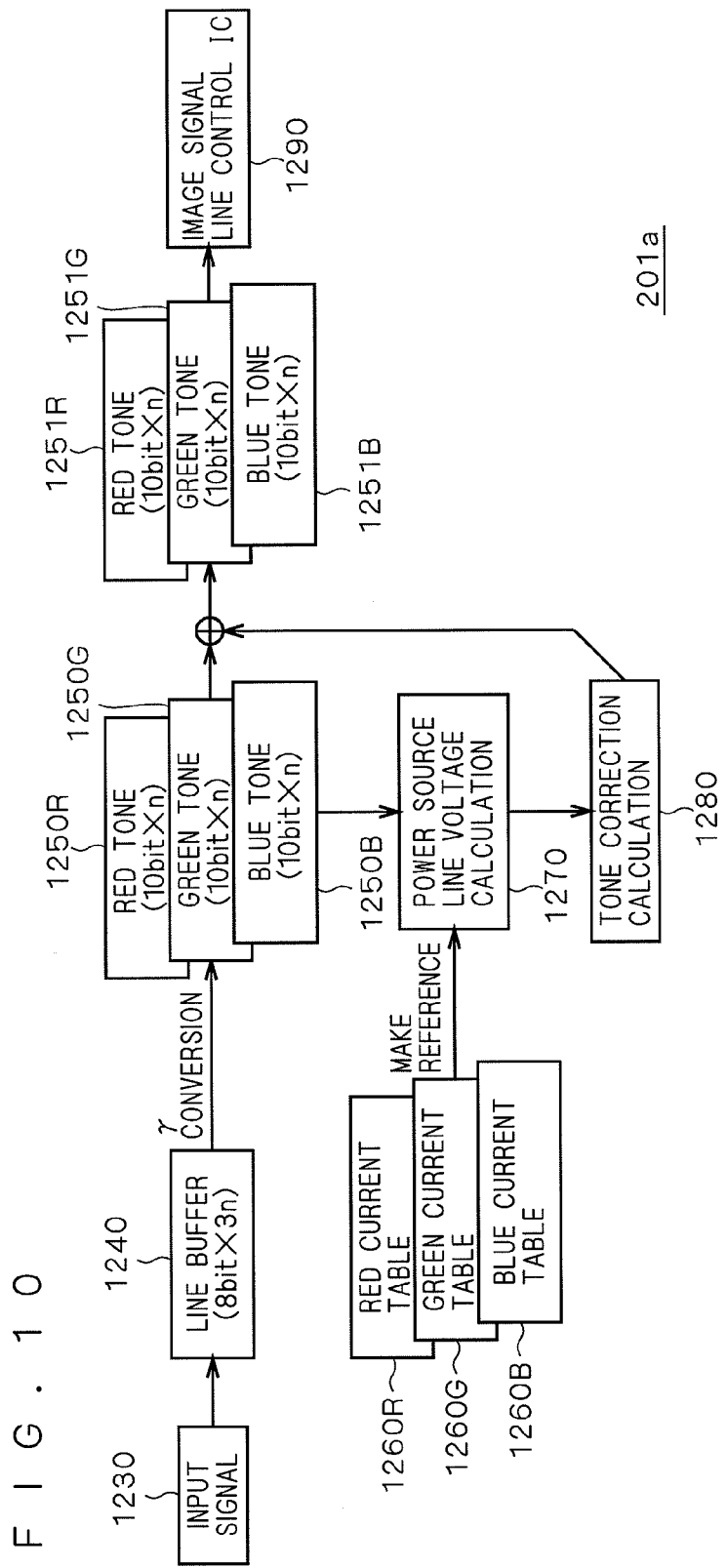
FIG. 10 is a functional block diagram showing tone processing performed in the image display device according to the first embodiment of the present invention.

FIG. 10 is a functional block diagram showing tone processing performed in the image display device 201a according to the first embodiment of the present invention. Although not shown, a plurality of pixel circuits each having the diode Oled (FIG. 1) are arranged in a matrix, and the power source line L1 is connected in common to the pixel circuits for each row in the image display device 201a. In the image display device 201a, tone processing is performed in such a way as to compensate for voltage drop according to wiring resistance and image data as discussed above, thereby suppressing trouble of irregularity in brightness level, cross talk or the like caused by voltage drop. That is, as wiring resistance and image data can be known prior to writing, the amount of voltage drop is predicted, and potential (−Vdata) and the like is controlled so that the current Ids at the same level as that at which no voltage drop is generated flows in the NMOS transistor Td of each pixel circuit. As a result, writing tone can be raised to the same brightness level as that at which no voltage drop is generated.

In FIG. 10, an input signal 1230 formed from uncorrected image data (first image data) input from the outside of the image display device 201a is accumulated in a line buffer 1240, and is thereafter subjected to γ conversion, thereby generating red tone data 1250R, green tone data 1250G and blue tone data 1250B. In the γ conversion, each tone in the image display device 201a is preferably in proportion to the potential of the image signal line L2.

A power source line voltage calculation part 1270 is a structure corresponding to a voltage drop deriving part. With reference to a red current table 1260R, a green current table 1260G and a blue current table 1260B for correlating tones and current values of respective colors, the power source line voltage calculation part 1270 obtains the current Ids flowing in the NMOS transistor Td of each pixel circuit by using the red tone data 1250G, the green tone data 1250G and the blue tone data 1250B generated by γ conversion and stored in storage means such as a memory. Using the current Ids thereby obtained and the wiring resistance value of the power source line L1, the predicted amount of voltage drop in each pixel circuit is calculated. Basically, the wiring resistance value of the power source line L1 is obtained based on uncorrected image data supplied to pixel circuits connected in common to the power source line L1.

A tone correction calculation part 1280 is a structure corresponding to a second image data deriving part, and obtains the amount of correction to be applied to the tone of each color using the calculated amount of voltage drop. This amount of correction is added to the red tone data 1250R, the green tone data 1250G and the blue tone data 1250B to generate red tone data 1251R, green tone data 1251G and blue tone data 1251B respectively. Then, second image data is generated by correcting the input signal 1230 formed from the first image data based on voltage drop that is expected to be generated in the power source line L1 according to the first image data and wiring resistance.

A image signal line control IC 1290 is a structure corresponding to a drive control part. The image signal line control IC 1290 controls the image signal line L2 based on the second image data to cause the diode Oled to emit light as already discussed with reference to FIG. 7.

The calculation of the amount of voltage drop at the power source line voltage calculation part 1270 is preferably performed for each pixel circuit throughout the image display device 201a. However, calculation is simplified where appropriate in order to avoid the calculation in an enormous amount. That is, in the case where the power source line L1 extends in the horizontal direction, and the wiring resistance of a grounding line for connecting the input terminal of the diode Oled to the ground is ignorable as shown in FIG. 8, voltage drop in the vertical direction is not required to be taken into account. So, only the amount of voltage drop in the horizontal direction is required to be calculated for each row using the line buffer 1240. In FIG. 11, only representative values of power source potentials gradually decreasing are shown for the simplification of illustration. In a structure where voltage drop should be considered in the vertical direction as well as in the horizontal direction, a frame buffer should be used for the calculation instead of the line buffer 1240.

FIG. 12 is a schematic view showing the amount of correction, namely the degree of raise A of a tone added to each column when the amount of voltage drop calculated for each column is the same as shown in FIG. 11. Like in FIG. 11, only representative values are shown in FIG. 12.

As shown in FIGS. 11 and 12, in the image display device 201a of the present embodiment, the potential of the power source line L1 becomes higher as a distance from the IC 220 becomes longer. Thus, Vgs of the NMOS transistor Td is increased to perform correction in order to avoid the reduction of the current Ids. More specifically, as discussed above, potential (−Vdata) and the like is controlled so that the current Ids at the same level as that at which no voltage drop is generated flows in the NMOS transistor Td of each pixel circuit. As a result, writing tone is raised to the same brightness level as that at which no voltage drop is generated.

Assuming that a 10-bit display tone is employed, that the display tone has linear relationship with the output of the image signal line L2, that the oscillation range of the image signal line L2 is 10 V, and that writing efficiency in a pixel circuit (ratio of the oscillation range of Vgs of the NMOS transistor Td to the oscillation range of the image signal line L1) is 0.5, for example, the degree of raise Δx of a tone is calculated as (x/0.5)×(1024/10) in order to increase Vgs of the NMOS transistor Td by x[V]. That is, the amount of correction is so calculated at the tone correction calculation part 1280 that a tone is raised by the degree of raise Δx.

As discussed, in the image display device 201a and a method of driving the same according to the first embodiment, voltage drop expected to be generated in the power source line L1 is calculated and correction is performed on image data on the basis of this voltage drop. Thus, trouble of irregularity in brightness level, cross talk or the like is suppressed, thereby improving image quality.

The voltage drop deriving step, the second image data deriving step and the light emission step may be all performed for each unit frame period, by which image quality may be improved further.

In the structure discussed above using FIG. 8 and others, the power source line L1 is connected in common to a plurality of pixel circuits for each row (in the horizontal direction). The power source line L1 may be connected in common not only for each row, but also for each column (in the vertical direction).

A plurality of pixel circuits are not necessarily required to be arranged in a matrix. An applicable structure is such that, a plurality of pixel circuits are arranged in a plane in a first direction and in a second direction different from the first direction, and the power source line L1 is connected in common for each column of pixel circuits formed by arranging a plurality of pixel circuits in the first direction.

In the first embodiment discussed above, NMOS transistors are used as transistors. Alternatively, PMOS transistors may be used.

Next, a second embodiment is discussed with reference to drawings.

<4. Noteworthy Point in Second Embodiment>

Figure 13:
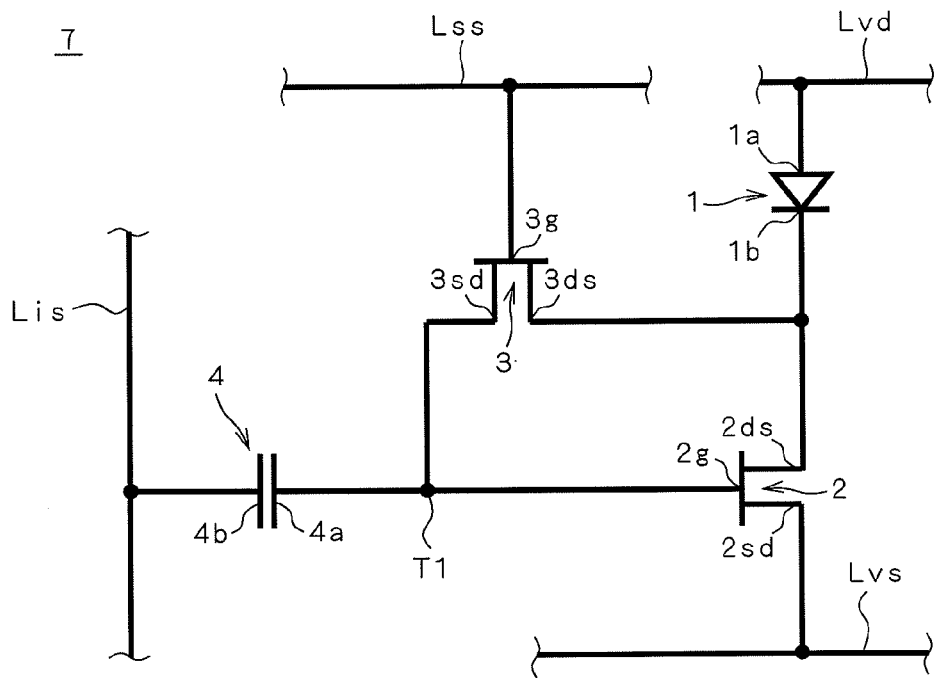
FIG. 13 is a circuit diagram showing the configuration of a pixel circuit according to a second embodiment of the present invention.

FIG. 13 is a circuit diagram showing the configuration of a pixel circuit 7 contained in an image display device according to a second embodiment of the present invention. Two or more of such pixel circuits 7 are arranged in a matrix in the image display device.

As shown in FIG. 13, the pixel circuit 7 includes an organic EL element (OLED) 1, a driving transistor 2, a threshold (Vth) compensation transistor 3, and a capacitor 4.

The organic EL element 1 is a light emitting element changing in brightness level of light emission according to the amount of current flowing in a light emitting layer. The organic EL element 1 has an anode electrode 1a and a cathode electrode 1b. The anode electrode 1a is electrically connected to a power source line (here, a VDD line Lvd) placed on the high-potential side during light emission of the organic EL element 1. The cathode electrode 1b is electrically connected through the driving transistor 2 to a power source line (here, a VSS line Lvs) placed on the low-potential side during light emission of the organic EL element 1. Namely, the VDD line Lvd and the VSS line Lvs apply a potential difference across the organic EL element 1 required for the light emission of the organic EL element 1. The VDD line Lvd and the VSS line Lvs are collectively referred to as "power source lines" where appropriate.

The driving transistor 2 is a transistor electrically connected in series to the organic EL element 1, and which controls a current flowing in the organic EL element 1 to control the brightness level of light emission of the organic EL element 1. Here, the driving transistor 2 is formed from a thin film transistor (TFT) as one of field effect transistors (FET) employing an MIS (metal insulator semiconductor) structure in which carriers are electrons (n type), namely an n-MISFETTFT.

The driving transistor 2 has first to third electrodes 2ds, 2sd and 2g. The first electrode 2ds is electrically connected to the cathode electrode 1b of the organic EL element 1, and serves as a drain electrode (hereinafter simply referred to as "drain") when the organic EL element 1 emits light, namely when a forward current flows in the organic EL element 1. The first electrode 2ds in turn serves as a source electrode (hereinafter simply referred to as "source") when a reverse current flows in the organic EL element 1. The second electrode 2sd is electrically connected to the VSS line Lvs, and serves as a source when a forward current flows in the organic EL element 1. The second electrode 2sd in turn serves as a drain when a reverse current flows in the organic EL element 1. The third electrode 2g is what is called a gate electrode (hereinafter simply referred to as "gate"), and is electrically connected to one electrode (seventh electrode 4a discussed later) of the capacitor 4.

In the driving transistor 2, a potential applied to the third electrode 2g, more particularly a voltage applied between the first electrode 2ds or the second electrode 2sd, and the third electrode 2g (namely, between the gate and the source) is controlled so that the amount of current flowing between the first electrode 2ds and the second electrode 2sd (hereafter also referred to as "between the first and second electrodes") is controlled. Based on the potential applied to the third electrode 2g, the driving transistor 2 is selectively placed in a state where a current can flow (conducting state), or in a state where current cannot flow (non-conducting state) between the first and second electrodes.

The Vth compensation transistor 3 is a transistor for detecting the lower limit of the potential of the third electrode 2g with respect to the second electrode 2sd of the driving transistor 2 (predetermined threshold voltage Vth) when the driving transistor 2 is in the conducting state, while adjusting the gate voltage of the driving transistor 2 to the threshold voltage Vth (hereinafter simply referred to as "threshold value Vth"). Like the driving transistor 2, the Vth compensation transistor 3 is also formed from an n-MISFETTFT.

The Vth compensation transistor 3 has fourth to sixth electrodes 3ds, 3sd and 3g. The fourth electrode 3ds is connected to an interconnect line for electrically connecting the first electrode 2ds of the driving transistor 2 and the cathode electrode 1b of the organic EL element 1, in such a way that the fourth electrode 3ds can electrically contact this interconnect line. The fifth electrode 3sd is connected at a node T1 to an interconnect line for electrically connecting the third electrode (gate) 2g of the driving transistor 2 and the seventh electrode 4a of the capacitor 4, in such a way that the fifth electrode 3sd can electrically contact this interconnect line. The sixth electrode 3g is what is called a gate electrode, and is electrically connected to a scanning signal line Lss.

In the Vth compensation transistor 3, a potential applied to the sixth electrode 3g, more particularly a voltage applied between the fourth electrode 3ds or the fifth electrode 3sd, and the sixth electrode 3g (namely, between the gate and the source) is controlled so that the amount of current flowing between the fourth electrode 3ds and the fifth electrode 3sd (hereinafter also referred to as "between the fourth and fifth electrodes") is controlled. Based on the potential applied to the sixth electrode 3g, the Vth compensation transistor 3 is selectively placed in a state where a current can flow (conducting state), or in a state where a current cannot flow (non-conducting state) between the fourth and fifth electrodes (between the drain and the source).

The brightness level of light emission of the organic EL element 1 is controlled by a current value, so the brightness level of light emission sensitively changes with the fluctuations in the gate voltage of the driving transistor 2 during light emission. Especially when the driving transistor 2 is made of amorphous silicon, the threshold value Vth tends to differ among driving transistors 2. So, some difference may be generated between a desired brightness level of light emission and an actual brightness level of light emission unless a function for compensating for the threshold value Vth that differs among pixels (Vth compensation function) is provided, resulting in irregularity in brightness level of light emission among pixels.

In response, the Vth compensation transistor 3 is provided to realize the Vth compensation function for compensating for the fluctuations in the threshold value Vth of the driving transistor 2 by adjusting the gate voltage of the driving transistor 2 to the threshold value Vth in each pixel before light emission.

The capacitor 4 has the seventh electrode 4a electrically connected to the third electrode 2g of the driving transistor 2, and an eighth electrode 4b electrically connected to an image signal line Lis. Here, the capacitor 4 has retention capacitance of a predetermined value Cs.

The organic EL element 1 serves as a capacitor when a voltage opposite to that applied during light emission is applied, with capacitance (EL element capacitance) of a predetermined value Co. The driving transistor 2 has parasitic capacitance CgsTd between the second electrode 2sd and the third electrode 2g (hereinafter also referred to as "between the second and third electrodes"), and parasitic capacitance CgdTd between the first electrode 2ds and the third electrode 2g (hereinafter also referred to as "between the first and third electrodes"). Further, the Vth compensation transistor 3 has parasitic capacitance CgsTth between the fifth electrode 3sd and the sixth electrode 3g (hereinafter also referred to as "between the fifth and sixth electrodes"), and parasitic capacitance CgdTth between the fourth electrode 3ds and the sixth electrode 3g (hereinafter also referred to as "between the fourth and sixth electrodes"). The parasitic capacitances CgsTd, CgdTd and CgsTth, CgdTth are determined by the structures of the driving transistor 2 and the Vth compensation transistor 3 respectively.

Figure 14:
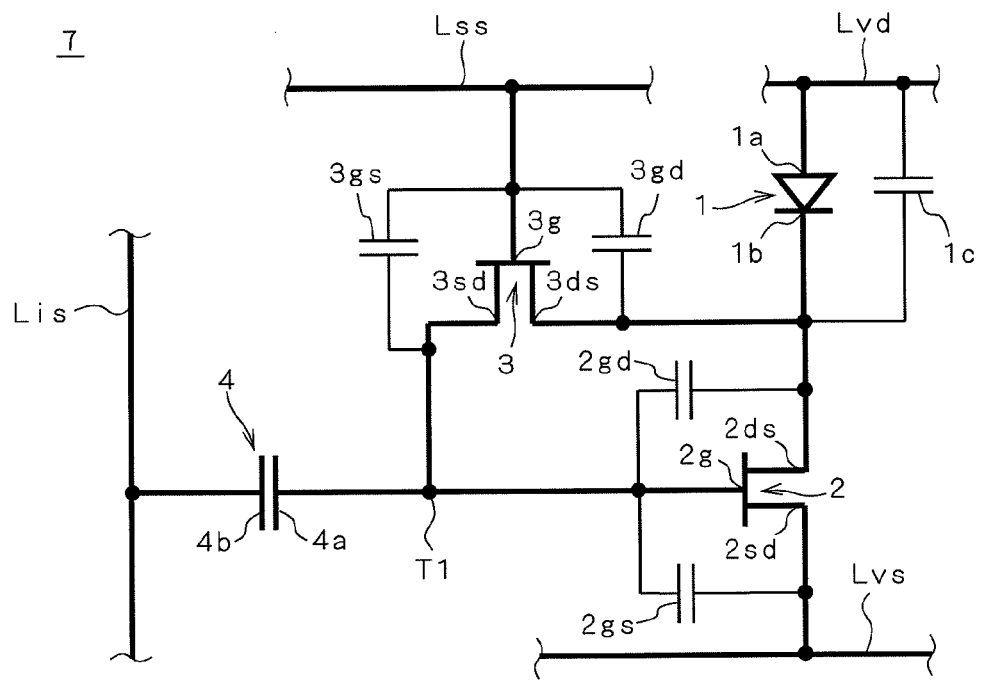
FIG. 14 is a circuit diagram schematically showing parasitic capacitances generated in the pixel circuit according to the second embodiment of the present invention.

FIG. 14 is a circuit diagram formed by adding a circuit configuration relating to the parasitic capacitances CgsTth, CgdTth, CgsTd, CgdTd and the EL element capacitance Co (indicated by thin lines in the drawing) to the circuit configuration of the pixel circuit 7 shown in FIG. 13 (indicated by heavy lines in the drawing).

As shown in FIG. 14, a state generated in the pixel circuit 7 is equivalent to a state where a capacitor (element capacitor) 1c with the EL element capacitance Co is placed between the two electrodes of the organic EL element 1, a capacitor 2gs with the parasitic capacitance CgsTd is placed between the second and third electrodes of the driving transistor 2, a capacitor 2gd with the parasitic capacitance CgdTd is placed between the first and third electrodes of the driving transistor 2, a capacitor 3gs with the parasitic capacitance CgsTth is placed between the fifth and sixth electrodes of the Vth compensation transistor 3, and a capacitor 3gd with the parasitic capacitance CgdTth is placed between the fourth and sixth electrodes of the Vth compensation transistor 3.

Here, attention is directed to one pixel circuit 7. However, many pixel circuits 7 exist throughout an organic EL display, so many scanning signal lines Lss are also provided. In the below, many scanning signal lines Lss are referred to as "$N^{th}$ scanning signal lines Lss (N is a natural number) where appropriate.

Figure 15:
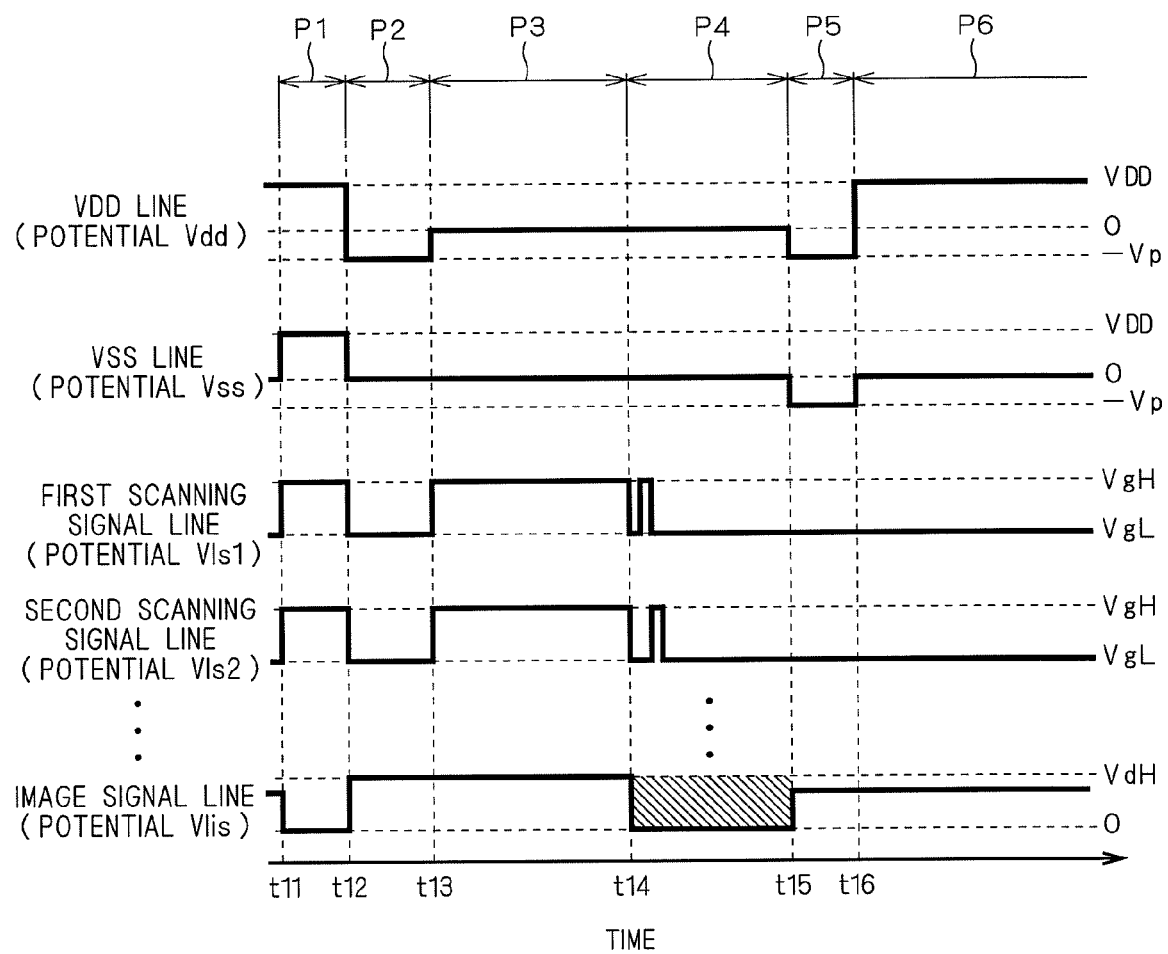
FIG. 15 is a timing chart showing driving waveforms relating to basic technology at a display part according to the second embodiment of the present invention.

FIG. 15 is a timing chart showing signal waveforms (driving waveforms) for causing the organic EL elements 1 to emit light. In FIG. 15, the horizontal axis shows time, and waveforms of (a) a potential applied to the VDD line Lvd (potential Vdd), (b) a potential applied to the VSS line Lvs (potential Vss), (c) the potential of a signal applied to a first scanning signal line Lss (potential Vls1), (d) the potential of a signal applied to a second scanning signal line Lss (potential Vls2), and (e) the potential of a signal applied to the image signal line Lis (potential Vlis) are shown in this order from the top.

FIG. 15 shows driving waveforms for causing the organic EL elements 1 to emit light once. A period relating to one light emission includes, in temporal order, a Cs initialization period P1 (from time t11 to time t12), a preparation period P2 (from time t12 to time t13), a Vth compensation period P3 (from time t13 to time t14), a writing period P4 (from time t14 to time t15), an element initialization period P5 (from time t15 to time t16), and a light emission period P6 (time t16 and thereafter). The potential Vlis in the writing period P4 has an arbitrary value determined by the brightness level of light emission of each organic EL element 1. Thus, for the purpose of convenience, an area in which this potential is expected to be present is diagonally hatched.

FIGS. 16 to 20 show, with attention directed to the pixel circuit 7, exemplary current flows in the pixel circuit 7 generated in each period when the display part 200a is driving. In FIGS. 16 to 20, in the pixel circuits 7, circuits contributing to current flows are indicated by heavy lines, and circuits making substantially no contribution to current flows are indicated by thin lines.

Figure 16:
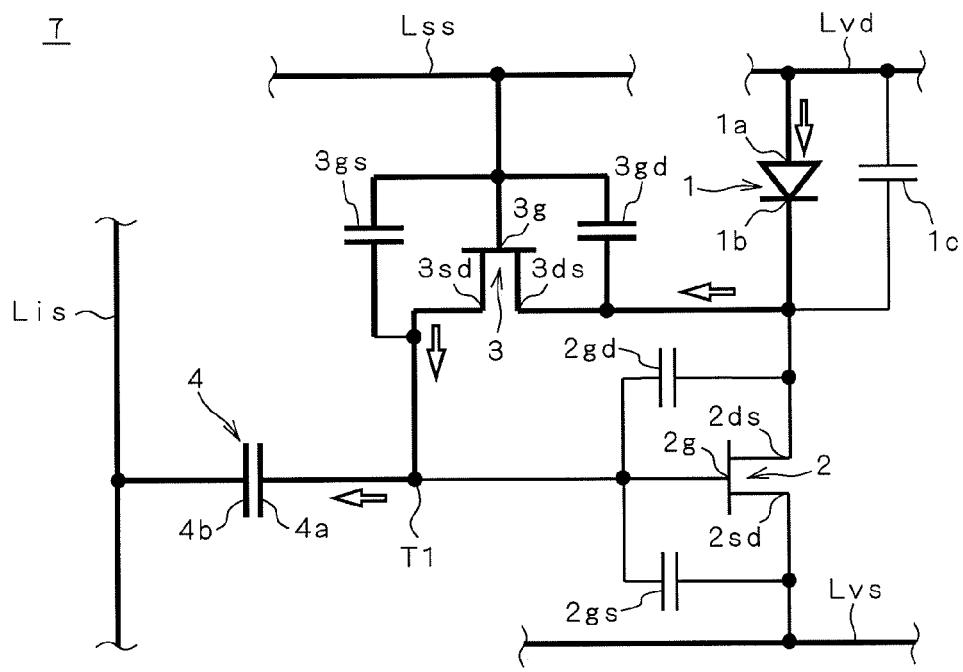
FIG. 16 is a circuit diagram showing the operation of the pixel circuit according to the second embodiment of the present invention.

In FIG. 16, an exemplary current flow in the pixel circuit 7 in the Cs initialization period P1 (hereinafter simply referred to as "period P1" where appropriate) is shown.

In the period P1, a high positive potential VDD of a certain level (15 V, for example) is applied to each of the VDD line Lvd and the VSS line Lvs. A high positive potential VgH of a certain level (18 V, for example) is applied to all scanning signal lines Lss. A reference potential of a certain level (here, 0 V) is applied to the image signal line Lis. At this time, by the application of the high potential VgH to the scanning signal line Lss, a positive potential responsive to the high potential VgH is applied to the sixth electrode (gate) 3g, thereby bringing the Vth compensation transistor 3 to the conducting state. The VDD line Lvd and the VSS line Lvs are approximately the same in potential. So, the driving transistor 2 virtually turns off to be brought to the non-conducting state. Thus, in the period P1, a current flows from the VDD line Lvd through the fourth and fifth electrodes 3ds and 3sd of the Vth compensation transistor 3 into the capacitor 4 as indicated by hollow arrows in FIG. 16. As a result, a certain amount of electric charge (amount of electric charge responsive to 15 V, for example) is accumulated in the capacitor 4.

Figure 17:
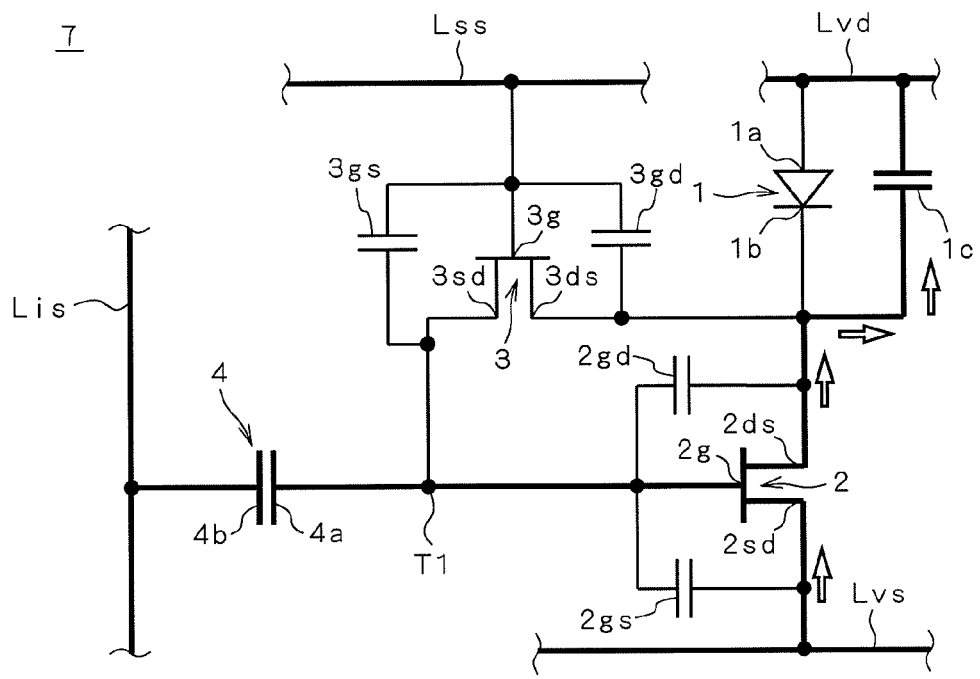
FIG. 17 is a circuit diagram showing the operation of the pixel circuit according to the second embodiment of the present invention.

In FIG. 17, an exemplary current flow in the pixel circuit 7 in the preparation period P2 (hereinafter simply referred to as "period P2" where appropriate) is shown.

In the period P2, a negative potential −Vp of a certain level (−7 V, for example) is applied to the VDD line Lvd. A reference potential of a certain level (here, 0 V) is applied to the VSS line Lvs. A low potential VgL of a certain level (−10 V, for example) is applied to all scanning signal lines Lss. A high potential VdH of a certain level (10 V, for example) is applied to the image signal line Lis. At this time, by the application of the low potential VgL to the scanning signal line Lss, substantially no positive potential is applied to the sixth electrode (gate) 3g, thereby bringing the Vth compensation transistor 3 to the non-conducting state. By the application of the high potential VdH to the image signal line Lis, a positive potential (15+10=25 V, for example) responsive to the high potential VdH is applied to the third electrode (gate) 2g, thereby bringing the driving transistor 2 to the conducting state. The VSS line Lvs is higher in potential than the VDD line Lvd by Vp, so a current flows from the VSS line Lvs through the second and first electrodes 2sd and 2ds of the driving transistor 2 into the organic EL element 1 as indicated by hollow arrows in FIG. 17. As a result, a certain amount of electric charge responsive to the potential difference between the VDD line Lvd and the VSS line Lvs (electric charge responsive to 7 V, for example) is accumulated in the organic EL element 1, namely the element capacitor 1c.

Figure 18:
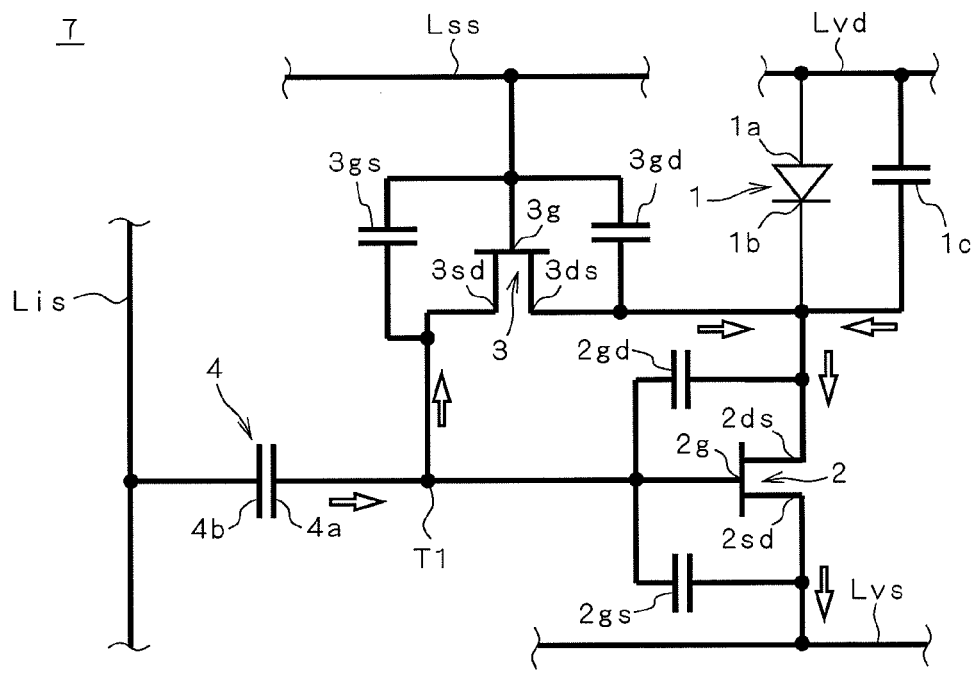
FIG. 18 is a circuit diagram showing the operation of the pixel circuit according to the second embodiment of the present invention.

In FIG. 18, an exemplary current flow in the pixel circuit 7 in the Vth compensation period P3 (hereinafter simply referred to as "period P3" where appropriate) is shown.

In the period P3, a reference potential of a certain level (here, 0 V) is applied to each of the VDD line Lvd and the VSS line Lvs. The high potential VgH is applied to all scanning signal lines Lss. The high potential VdH (10 V, for example) is applied to the image signal line Lis. At this time, by the application of the high potential VgH to the scanning signal line Lss, a positive potential responsive to the high potential VgH is applied to the sixth electrode (gate) 3g, thereby bringing the Vth compensation transistor 3 to the conducting state. Bringing the Vth compensation transistor 3 to the conducting state causes a short-circuit between the capacitor 4 and the element capacitor 1e, so that a voltage slightly higher than a voltage applied to the element capacitor 1c (7 V) is applied to T1. When this voltage is higher than the threshold value Vth of the driving transistor 2, a current flows through the first and second electrodes 2ds and 2sd of the driving transistor 2 into the VSS line Lvs. A current induced by the electric charge accumulated in the element capacitor 1c further flows through the first and second electrodes 2ds and 2sd of the driving transistor 2 into the VSS line Lvs.

As a current induced by the electric charge accumulated in the capacitor 4 flows from the capacitor 4 into the VSS line Lvs, the electric charge accumulated in the capacitor 4 is reduced. When the potential Vgs of the third electrode 2g with respect to the second electrode 2sd of the driving transistor 2 drops to a level substantially the same as the threshold value Vth, the driving transistor 2 is brought to the non-conducting state. At this time, electric charge responsive to the threshold value Vth is accumulated in the capacitor 4. Thus, in the period P3, electric charge responsive to the threshold value Vth is accumulated in the capacitor 4, so that variations in the threshold value Vth differing among the pixels are compensated for.

Figure 19:
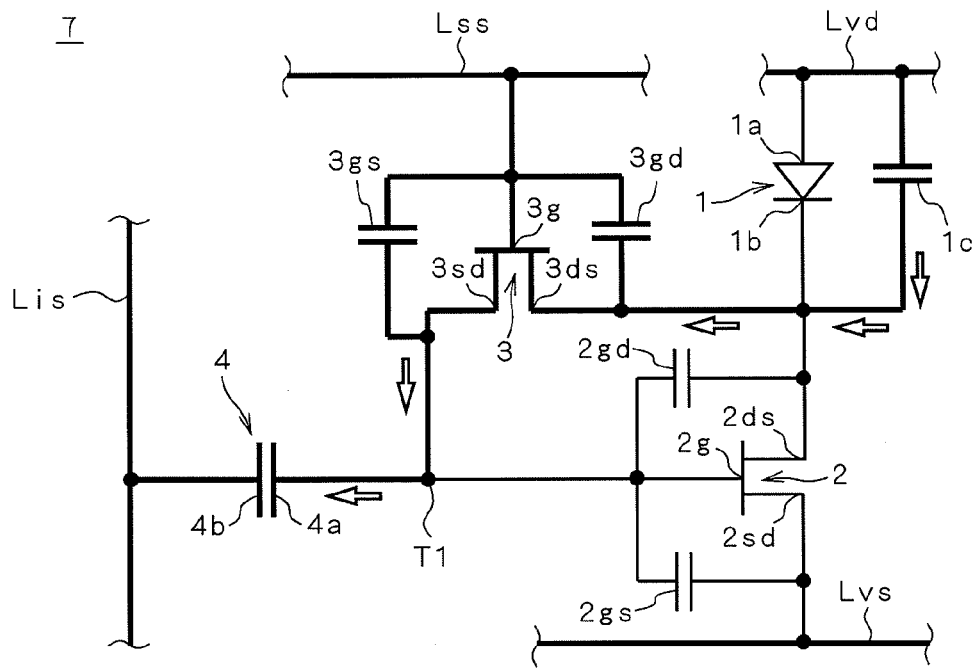
FIG. 19 is a circuit diagram showing the operation of the pixel circuit according to the second embodiment of the present invention.

In FIG. 19, an exemplary current flow in the pixel circuit 7 in the writing period P4 (hereinafter simply referred to as "period P4" where appropriate) is shown.

In the period P4, the reference potential 0 V is applied to each of the VDD line Lvd and the VSS line Lvs. The high potential VgH is applied to the scanning signal line Lss in a pixel to be subjected to a process of accumulating electric charge responsive to a tone represented by image data (writing process). A potential (VdH−Vdata) is applied to the image signal line Lis. The potential Vdata corresponds to the tone of each pixel represented by image data. At this time, by the application of the high potential VgH to the scanning signal line Lss, a positive potential responsive to the high potential VgH is applied to the gate 3g, thereby bringing the Vth compensation transistor 3 to the conducting state. By the application of the potential (VdH−Vdata) to the image signal line Lis not higher than the potential VdH applied in the period P3, the gate voltage becomes the threshold value Vth or lower, thereby bringing the driving transistor 2 to the non-conducting state. Thus, in the period P4, a current flows from the organic EL element 1 (namely, the element capacitor 1c) through the fourth and fifth electrodes 3ds and 3sd of the Vth compensation transistor 3 into the capacitor 4 as indicated by hollow arrows in FIG. 19. As a result, electric charge responsive to the potential Vdata is accumulated in the capacitor 4 in addition to the electric charge already accumulated and responsive to the threshold value Vth. Namely, in the period P4, electric charge responsive to the brightness level of light emission of the organic EL element 1 is accumulated in the capacitor 4.

The amount of change in potential of the seventh electrode 4a of the capacitor 4 (gate potential of the driving transistor 2) is virtually the product of the amount of change in potential of the image signal line Lis, and the ratio (capacity ratio) between the retention capacitance Cs of the capacitor 4 and the EL element capacitance Co of the element capacitor 1c. Namely, in the second embodiment, when the potential of the image signal line Lis changes from VdH to (VdH−Vdata), the gate potential of the driving transistor 2 changes by −Vdata·Cs/(Cs+Co). As an example, assuming that Vdata=5V and Cs:Co=1:2, the gate potential of the driving transistor 2 changes by −5·1/(1+2)=−5/3 V as electric charge moves from the organic EL element 1 to the capacitor 4. By the move of the electric charge accumulated in the capacitor 4, the change in potential of the image signal line Lis is reflected upon the gate potential of the driving transistor 2.

In the element initialization period P5 (hereinafter simply referred to as "period P5" where appropriate), the negative potential −Vp of a certain level is applied to each of the VDD line Lvd and the VSS line Lvs. The low potential VgL is applied to all scanning signal lines Lss. A high potential (VdH−Va) (Va=1 V, for example) is applied to the image signal line Lis. At this time, the Vth compensation transistor 3 is brought to the non-conducting state and the driving transistor 2 is brought to the conducting state. Further, there is no potential difference between the VDD line Lvd and the VSS line Lvs, and the VSS line Lvs is set at the negative potential −Vp. So, the electric charge accumulated in the organic EL element 1 (namely, the element capacitor 1c) exits therefrom toward the VSS line Lvs, by which the electric charge accumulated in the organic EL element 1 is released.

Figure 20:
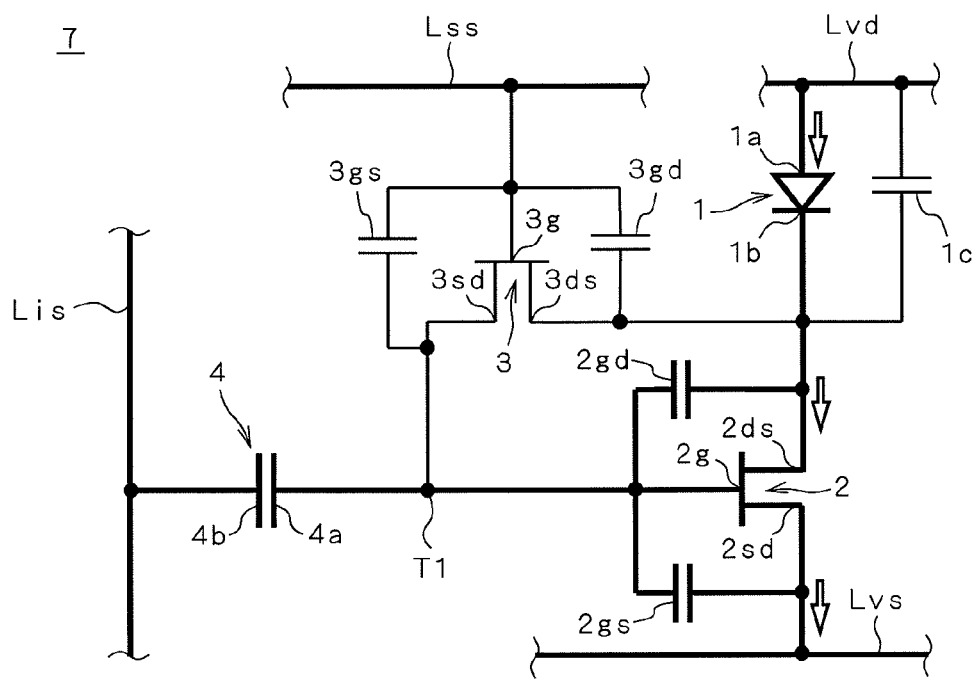
FIG. 20 is a circuit diagram showing the operation of the pixel circuit according to the second embodiment of the present invention.

In FIG. 20, an exemplary current flow in the pixel circuit 7 in the light emission period P6 (hereinafter simply referred to as "period P6" where appropriate) is shown.

In the period P6, the high positive potential VDD is applied to the VDD line Lvd whereas the reference potential 0 V is applied to the VSS line Lvs. The low potential VgL is applied to the scanning signal lines Lss, and the high potential (VdH−Va) is applied to the image signal line Lis. At this time, by the application of the low potential VgL to the scanning signal line Lss, the Vth compensation transistor 3 is brought to the non-conducting state. Further, as the high potential VdH−Va is applied to the image signal line Lis, Vgs is increased to a level higher than the threshold value Vth by a potential responsive to the amount of electric charge accumulated in the capacitor 4 in the period P4 (the amount of electric charge responsive to the potential Vdata), thereby bringing the driving transistor 2 to the conducting state. As an example, assuming that Va=1 V, Vdata=5 V and Cs:Co=1:2, the electric charge accumulated in the capacitor 4 in the period P4 corresponds to a potential lower than the threshold value Vth by 5/3 V ([Vth−5/3] V). In the period P6, a potential higher than the potential applied in the period P4 by (Vdata−Va) (=4 V) is applied to the image signal line Lis, and a potential higher than the threshold value Vth by 7/3 V ([Vth+7/3 V]=[Vth−(5/3)+4] V]) is applied to the third electrode (gate) 2g. That is, the image signal line Lis causes a potential responsive to the potential Vdata corresponding to a tone represented by image data to be applied to the third electrode (gate) 2.

The VDD line Lvd is higher in potential than the VSS line Lvs by the potential VDD, and the driving transistor 2 is brought to the conducting state where a current flows between the first and second electrodes in response to the potential Vdata. Thus, a current responsive to the potential Vdata flows into the organic EL element 1, and a current is supplied from the VDD line Lvd to the organic EL element 1 as indicated by hollow arrows in FIG. 20. As a result, the organic EL element 1 emits light at a brightness level responsive to the potential Vdata. That is, in the period P6, light of a brightness level responsive to data (tone data) indicating the tone of each pixel included in image data is emitted from each pixel.

Here, Vgs is determined by the following equation (1) using constants α and d when the organic EL element 1 emits light:

$$Vgs = Vth + \alpha \times Vdata + d \quad (1)$$

The current Ids flowing between the first and second electrodes (between the drain and the source) of the driving transistor 2 is determined by the following equation (2) using a constant β:

$$Ids = (\beta/2) \times (Vgs - Vth)^2 = (\beta/2) \times (\alpha \times Vdata + d)^2 \quad (2)$$

The brightness level of light emission of the organic EL element 1 is substantially in proportion to the density of a current (current density) flowing in the organic EL element 1. So, a desirable brightness level of light emission is obtained in each pixel by performing the control using the driving waveforms shown in FIG. 15.

The constant α used in the above equation (1) is a factor for providing the ratio of the range of change of Vgs to the range of change of a potential applied to the image signal line Lis. In the below, the factor a may also be referred to as "writing efficiency." The writing efficiency α in the pixel circuit 7 is subjected to the influence of parasitic capacitance, and is expressed by the following equation (3) accordingly:

$$\alpha = \{[Co + CgdTth)/(Co + Cs + CgsTth + CgdTth + CgsTd) \times (Cs/Cs')\} \quad (3)$$

Cs' in the above equation (3) satisfies the following equation (4):

$$Cs' = Cs + CgsTth + CgsTd + CgdTd \quad (4)$$

Figure 21:
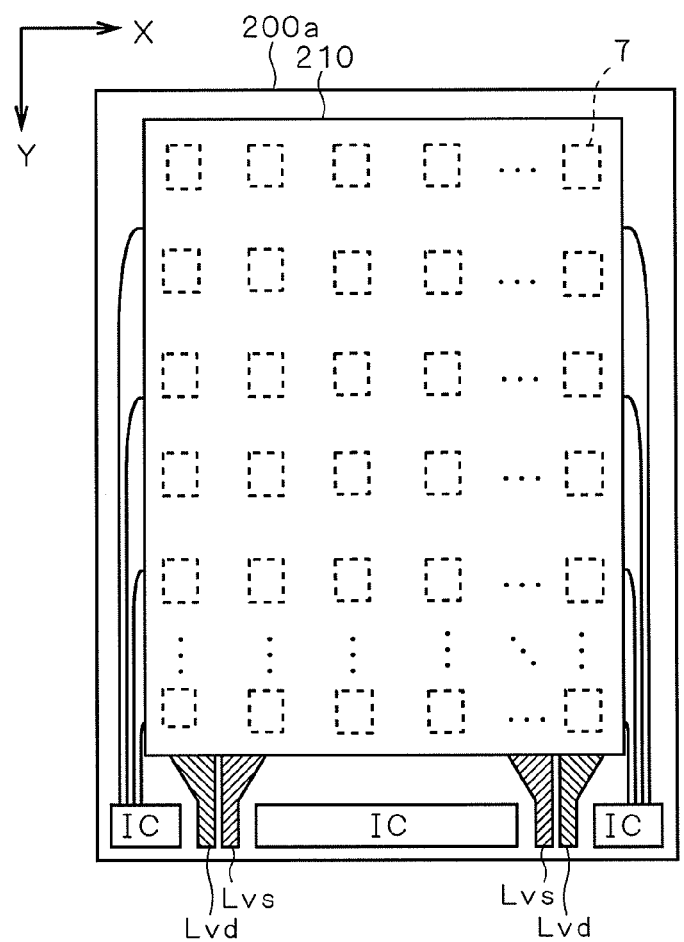
FIG. 21 is a schematic view showing the arrangement of a plurality of pixel circuits in an image display device according to the second embodiment of the present invention.

FIG. 21 is a schematic view showing an arrangement of a plurality of pixel circuits 7 in an display part 200a included in the image display device. In FIG. 21, two axes X an Y orthogonal to each other are shown.

As shown in FIG. 21, the display part 200a includes an image display region 210, the VDD lines Lvd, the VSS lines Lvs, and ICs (driving ICs) for driving the pixel circuits.

In the image display region 210, the plurality of pixel circuits 7 are arranged in a matrix in a row direction (horizontal direction, namely X direction in the drawing), and in a column direction (vertical direction, namely Y direction in the drawing). By the emission of light at each organic EL element 1 in each pixel circuit 7, the image display region 210 emits light to serve as a region for displaying an image (hereinafter also referred to as "light emission region").

An electric supply part not shown is provided on the bottom side of the display part 200a. The electric supply part supplies currents and voltages to the VDD lines Lvd and the VSS lines Lvs. Namely, electric power is supplied from the bottom side of the display part 200a to the VDD lines Lvd and the VSS lines Lvs. The VDD lines Lvd and the VSS lines Lvs are each electrically connected in common to all of the pixel circuits 7 arranged in a matrix in the image display region 210. The VDD lines Lvd and the VSS lines Lvs supply currents from the lower end (in FIG. 21, the end in the +Y direction) toward the upper end (in FIG. 21, the end in the −Y direction) in the image display region 210, at least when each organic EL element 1 emits light. The ICs (driving ICs) for driving the pixel circuits are provided near the lower end of the display part 200a.

The VDD lines Lvd and the VSS lines Lvs have wiring resistances, so changes in potential (potential change) are generated according to currents flowing. Thus, a pixel circuit far from the electric supply part is subjected to great changes in potential of the VDD lines Lvd and the VSS lines Lvs. So, the gate voltage Vgs and the drain potential Vds with respect to the source potential of the driving transistor 2 are small even when the same electric charge is accumulated in the capacitor 4 during light emission. Further, by the presence of parasitic capacitance in the pixel circuit 7, changes in potential of the VDD lines Lvd and the VSS lines Lvs directly change the gate potential of the driving transistor 2.

In an image displayed in the image display region 210, these changes in Vgs, Vds and in the gate potential generate trouble of irregularity in brightness level in which a brightness level is lower as a distance to the side apart from the electric supply part (termination sides of the power source lines) is shorter, and is higher as a distance to the electric supply part is shorter. As a result, deterioration of image quality may occur.

Figure 22:
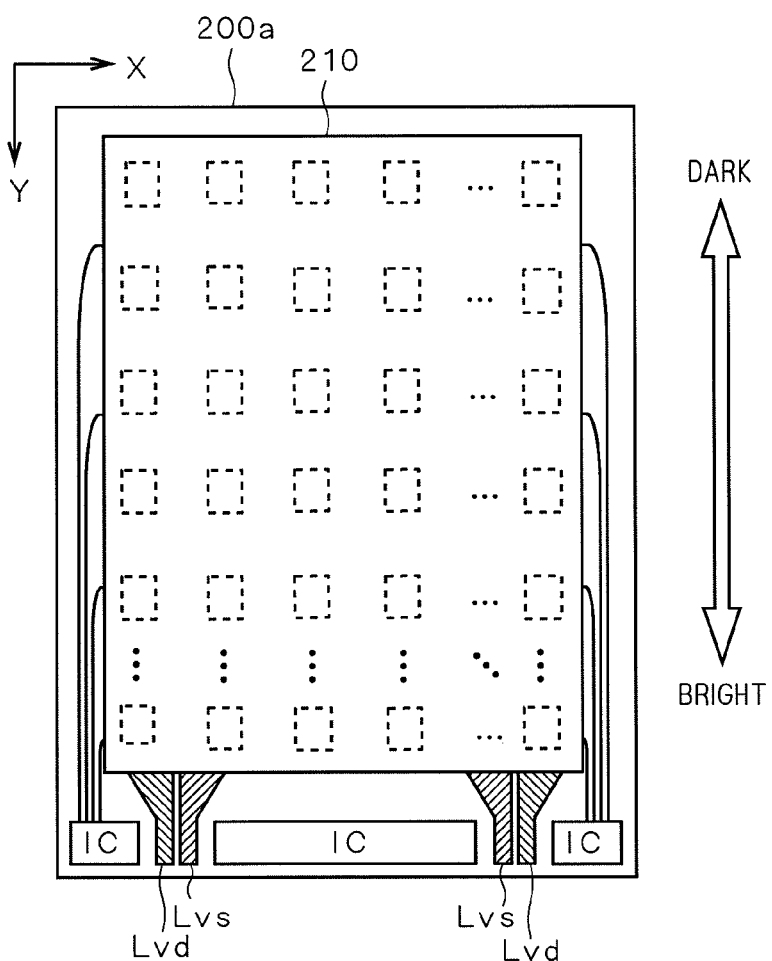
FIG. 22 is a schematic view showing the influence that is exerted by potential changes caused by wiring resistances according to the second embodiment of the present invention.

FIG. 22 is a schematic view showing an example of influence exerted by potential changes that are caused by the wiring resistances of the VDD lines Lvs and the VSS lines Lvs. As shown in FIG. 22, in an image displayed in the image display region 210, a brightness level is lower as a distance to the side apart from the electric supply part (termination sides of the power source lines) is shorter, and is higher as a distance to the electric supply part is shorter.

In response to this problem, the inventors of the present invention have made an image display deice and a method of driving the same capable of improving image quality by suppressing trouble of irregularity in brightness level, as is discussed below.

<5. Second Embodiment>
<5-1. Outline of Image Display Device>

Figure 23:
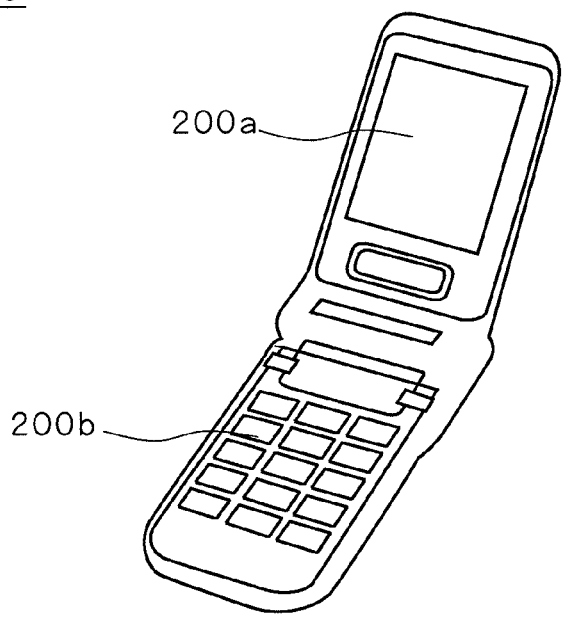
FIG. 23 shows an example of the schematic structure of the image display device according to the second embodiment of the present invention.

FIG. 23 shows an example of the schematic structure of an image display device 200 according to the second embodiment.

The image display device 200 is a portable phone, namely a portable electronic device with the display part 200a and a body part 200b, and various types of images such as moving images and still images are displayed on the display part 200a.

The body part 200b has a communication function, an electric supply function such as a battery, an operation part and the like. The display part 200a has an organic EL display (organic electroluminescence display) substantially rectangular in outline, and driver means to which various signals supplied from the body part 200b are given. The organic EL display has a self-luminous light emitting element where, by causing a current to flow into an organic material, the material itself emits light.

The display part 200a has a structure as discussed with reference to FIGS. 13 to 21. Namely, in the image display device 200, as already discussed with reference to FIG. 21, the plurality of pixel circuits 7 (FIG. 13) each having the organic EL element 1 are arranged in a matrix. In the image display device 200, further, the VDD lines Lvd and the VSS lines Lvs are electrically connected in a lattice pattern to all of the pixel circuits 7 arranged in a matrix in the image display region 210.

In the writing period P4, the plurality of pixel circuits 7 in the image display region 210 are sequentially subjected to the accumulation of electric charge into the capacitors 4 (writing process) based on image data and for each line of pixels (for each row extending along the X axis in FIG. 21), in order of increasing distance from the side away from the electric supply part (termination sides of the power source lines). The order of writing process is easily set by changing the settings of the driving ICs.

<5-2. Functional Configuration of Image Display Device>

Figure 24:
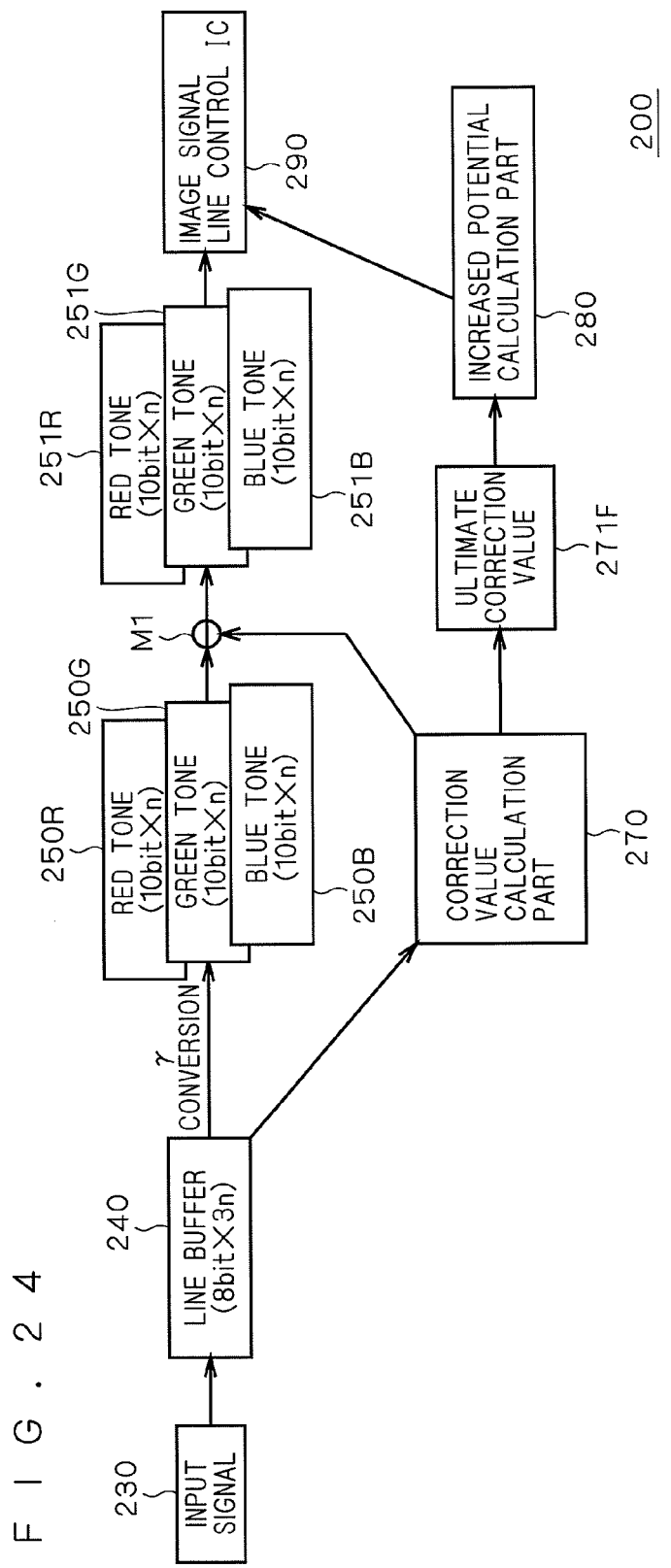
FIG. 24 is a block diagram showing a functional configuration relating to tone processing in the image display device according to the second embodiment of the present invention.

FIG. 24 is a block diagram showing a functional configuration relating to tone processing in the image display device 200.

In the image display device 200, potential change discussed above in response to the wiring resistance of the power source line and image data is corrected, so that trouble of irregularity in brightness level generated by the potential change is suppressed. Namely, in writing process targeted for the pixel circuits 7 in each row, a correction value responsive to the potential changes of the VDD line Lvd and the VSS line Lvs is calculated to control a potential (−Vdata) applied to the image signal line Lis and the like based on this correction value. Here, a correction value responsive to the potential changes of the VDD line Lvd and the VSS line Lvs is subtracted from tone data after γ conversion to thereby suppress irregularity in brightness level.

In FIG. 24, an input signal 230 formed from image data input from the outside of the image display device 200 is formed from image data including tone data which corresponds to each pixel circuit 7, namely each pixel. After being accumulated into the line buffer 240, the input signal 230 is subjected to γ conversion, thereby generating red tone data 250R, green tone data 250G and blue tone data 250B. The tones after γ conversion are each preferably in proportion to the potential of the image signal line Lis.

Each time data indicative of the tones of pixels in each row is stored in the line buffer 240, a correction value calculation part 270 derives a correction value responsive to the potential changes of the VDD line Lvd and the VSS line Lvs from the tone data of pixels in each row.

The sum of respective currents flowing in the plurality of pixel circuits 7 for constituting a certain row according to image data is calculated from the tone data of pixels corresponding to the certain row. The potential changes of the VDD line Lvd and the VSS line Lvs in the certain row are obtained from a value determined by adding current values together in all rows from a row on the termination side of the image display region 210 (from the −Y direction in FIG. 21) to the certain row, and from the wiring resistances of the VDD line Lvd and the VSS line Lvs.

As an example, with regard to the uppermost row in the image display region 210 shown in FIG. 21, the potential changes of the VDD Lvd line and the VSS line Lvs between the uppermost row and a next row below, namely a subsequent row are in proportion to the sum of currents flowing in all the pixel circuits 7 in the uppermost row. As another example, with regard to an $N^{th}$ row (N is a natural number) from the termination side (in the −Y direction in FIG. 21) in the image display region 210, the potential changes of the VDD line Lvd and the VSS line Lvs between the $N^{th}$ row and a next row below, namely an $(N+1)^{th}$ row are in proportion to the sum of currents flowing in all the pixel circuits 7 from the first row to the $N^{th}$ row. Thus, a correction value for canceling difference in brightness level caused by the potential changes of the VDD line Lvd and the VSS line Lvs is easily obtained by proportional calculation of the sum of currents.

Next, a method of deriving a correction value is discussed in detail.

First, it is assumed that each row of pixels for constituting the image display region 210 is formed from pixels for emitting red light (R pixels), pixels for emitting green light (G pixels), and pixels for emitting blue light (B pixels) sequentially aligned in this order.

By way of example, the current light emission efficiencies of the organic EL elements 1 of an R pixel, a G pixel and a B pixel are identified as Er, Eg and Eb[cd/A] respectively, the luminous intensity of an R pixel at the highest tone during light emission is identified as Yr[cd], the luminous intensity of a G pixel at the highest tone during light emission is identified as Yg[cd], and the luminous intensity of a B pixel at the highest tone during light emission is identified as Yb[cd]. Further, the luminous intensity of each pixel is in proportion to a tone before γ conversion raised to the power of γ, where γ is generally 2.2.

Here, the number of pixels constituting one row is 3w, R pixels constituting one row include first to $w^{th}$ R pixels, G pixels constituting one row include first to $w^{th}$ G pixels, and B pixels constituting one row include first to $w^{th}$ B pixels. Further, with regard to a $y^{th}$ row from the terminal side that is farthest from the electric supply part, the tone of an $x^{th}$ R pixel before γ conversion from an end of the image display region 210 in a predetermined direction (from the left in FIG. 21, for example) is identified as Lr(x, y), the tone of an $x^{th}$ G pixel before γ conversion is identified as Lg(x, y), the tone of an $x^{th}$ B pixel before γ conversion is identified as Lb(x, y), and the highest tones of R, G and B pixels before γ conversion are identified as Lm. Then, a current Ir(x, y) flowing in the organic EL element 1 of the $x^{th}$ R pixel in the $y^{th}$ row during light emission, a current Ig(x, y) flowing in the organic EL element 1 of the $x^{th}$ G pixel in the $y^{th}$ row during light emission, and a current Ib(x, y) flowing in the organic EL element 1 of the $x^{th}$ B pixel in the $y^{th}$ row during light emission are expressed by the following equations (5) to (7) respectively:

[Formula 1]

$$Ir(x, y) = \left(\frac{Lr(x, y)}{Lm}\right)^\gamma \frac{Yr}{Er} \tag{5}$$

$$Ig(x, y) = \left(\frac{Lg(x, y)}{Lm}\right)^\gamma \frac{Yg}{Eg} \tag{6}$$

$$Ib(x, y) = \left(\frac{Lb(x, y)}{Lm}\right)^\gamma \frac{Yb}{Eb} \tag{7}$$

The sum of currents I(y) flowing in the organic EL elements 1 of all pixels belonging to the $y^{th}$ row during light emission is expressed by following equation (8):

[Formula 2]

$$\begin{aligned} I(y) &= \sum_{x=1}^{W} (Ir(x, y) + Ig(x, y) + Ib(x, y)) \\ &= \sum_{x=1}^{W} \left(\left(\frac{Lr(x, y)}{Lm}\right)^\gamma \frac{Yr}{Er} + \left(\frac{Lg(x, y)}{Lm}\right)^\gamma \frac{Yg}{Eg} + \left(\frac{Lb(x, y)}{Lm}\right)^\gamma \frac{Yb}{Eb}\right) \\ &= \frac{Yr}{Lm^\gamma Er} \sum_{x=1}^{W} (Lr(x, y)^\gamma) + \frac{Yg}{Lm^\gamma Eg} \sum_{x=1}^{W} (Lg(x, y)^\gamma) + \\ &\quad \frac{Yb}{Lm^\gamma Eb} \sum_{x=1}^{W} (Lb(x, y)^\gamma) \end{aligned} \tag{8}$$

By the current I(y), and the wiring resistances of the VDD line Lvd and the VSS line Lvs, the potential of the VDD line Lvd becomes lower while the potential of the VSS line Lvs becomes higher as a distance from the electric supply part becomes longer.

Here, compared to the potential of the VSS line Lvs in the $(y−1)^{th}$ row, the potential of the VSS line Lvs is relatively low in the $y^{th}$ row closer to the electric supply part. Compared to the potential of the VDD line Lvd in the $(y−1)^{th}$ row, the potential of the VDD line Lvd is relatively high in the $y^{th}$ row closer to the electric supply part. Further, currents flowing in the power source lines in the $y^{th}$ row are the sum of currents flowing in the organic EL elements 1 of all pixels from the first row to the $y^{th}$ row during light emission.

Here, the number of rows of the pixel circuits 7 arranged adjacent to each other in the image display region 210 is h, a first row to an $h^{th}$ row are sequentially arranged from the termination sides of the power source lines, the wiring resistance of one VSS line Lvs in the vertical direction is Rs[Ω], and the wiring resistance of one VDD line Lvd in the vertical direction is Rd[Ω]. Then, the potential difference ΔVs(y) of the VSS line Lvs in the $y^{th}$ row with respect to the VSS line Lvs in the $(y−1)^{th}$ row (in the case of the first row, the potential difference of the VSS line Lvs in the first row with respect to the termination side), and the potential difference ΔVd(y) of the VDD line Lvd in the $y^{th}$ row with respect to the VDD line Lvd in the $(y−1)^{th}$ row (in the case of the first row, the potential difference of the VDD line Lvd in the first row with respect to the termination side) are expressed by the following equations (9) and (10) respectively:

[Formula 3]

$$\Delta Vs(y) = -Rs\sum_{k=1}^{y} I(k) \quad (9)$$
$$= -RsI(y) + \Delta Vs(y-1)$$

$$\Delta Vd(y) = Rd\sum_{k=1}^{y} I(k) \quad (10)$$
$$= RdI(y) + \Delta Vd(y-1)$$

Here, relations $\Delta Vs(0)=0$, and $\Delta Vs(0)=0$ are established. Further, relations $\Delta Vs(y) \leqq 0$ and $\Delta Vd(y) \geqq 0$ are established.

When the potential change of the VSS line Lvs from the termination side to the $y^{th}$ row is identified as Vs(y) and the potential change of the VDD line Lvd from the termination side to the $y^{th}$ row is Vd(y), Vs(y) and Vd(y) that are the sums of potential changes from the first row to the $y^{th}$ row are respectively expressed by the following equations (11) and (12):

[Formula 4]

$$\Delta Vs(y) = \sum_{k=1}^{y} \Delta Vs(k) \quad (11)$$
$$= \Delta Vs(y) + Vs(y-1)$$

$$\Delta Vd(y) = \sum_{k=1}^{y} \Delta Vd(k) \quad (12)$$
$$= \Delta Vd(y) + Vd(y-1)$$

Relations $Vs(0) \leqq 0$ and $Vd(y) \geqq$ are established.

The advantage of employing the method of deriving a correction value according to the second embodiment is discussed next.

Potential change Vs'(y) of the VSS line Lvs from the $h^{th}$ row nearest to the electric supply part to the $y^{th}$ row, and potential change Vd'(y) of the VDD line Lvd from the $h^{th}$ row nearest to the electric supply part to the $y^{th}$ row are respectively expressed by the following equations (13) and (14):

[Formula 5]

$$Vs'(y) = Vs(y) - Vs(h) \quad (13)$$
$$= -\sum_{k=y+1}^{h} \Delta Vs(k)$$

$$Vd'(y) = Vd(y) - Vd(h) \quad (14)$$
$$= -\sum_{k=y+1}^{h} \Delta Vd(k)$$

If the potential changes of the VSS line Lvs and the VDD line Lvd are to be corrected with respect to the $h^{th}$ row nearest to the electric supply part, Vs'(y) and Vd'(y) should be obtained. In order to make such correction, tone data of all pixels from the first row to the $h^{th}$ row should be acquired to calculate a correction value prior to writing process into the pixel circuits 7 in the first row. This results in a longer period of time necessary for the acquisition of tone data required for calculation, and a larger calculation amount.

However, in the method of deriving a correction value according to the second embodiment, a correction value is derived each time while tone data corresponding to one row is acquired. More specifically, when the pixel circuits 7 in the $y^{th}$ row are subjected to writing process, tone data correction is so performed that the potential changes of the power source lines on the termination side and in the $y^{th}$ row are apparently the same. Namely, tone data correction is not intended to adjust the potential changes of the power source lines to their lowest levels. Rather, tone data correction is intended to adjust the potential changes of the power source lines to their highest levels. Thus, in the method of deriving a correction value according to the second embodiment, potential changes Vs(y) and Vd(y), and not Vs'(y) and Vd'(y), are obtained.

The discussion of the method of deriving a correction value according to the second embodiment continues.

When the potentials of the VSS line Lvs and the VDD line Lvd change, the amount of change in the gate voltage Vgs of the driving transistor 2 of each pixel during light emission depends on the configuration of a pixel circuit. With regard to the pixel circuit 7 according to the second embodiment, the amount of change $\Delta Vgs(y)$ between the gate voltage Vgs of the driving transistor 2 on the termination side and the gate voltage Vgs of the driving transistor 2 in the $y^{th}$ row is expressed by the following equation (15):

[Formula 6]

$$\Delta Vgs(y) = \frac{-(Cs + CgsTth + CgdTd)Vs(y) + CgdTd \cdot Vd(y)}{Cs'} \quad (15)$$

As relations $Vs(y) \leqq 0$ and $Vd(y) \geqq 0$ are established, a relation $\Delta Vgs(y) \geqq 0$ is established. Here, with respect to the row nearest to the termination side, a differential between the gate voltage Vgs and the threshold value Vth (Vgs−Vth) of a pixel circuit in the $x^{th}$ column and $y^{th}$ row is identified as Vgs'(x, y) that is expressed by the following equation (16):

[Formula 7]

$$Vgs'(x,y) = \alpha V\text{data} + d + \Delta Vgs(y) \quad (16)$$

In order to correct a potential applied to the image signal line Lis in the $y^{th}$ row during writing process to make (Vgs−Vth) in the row nearest to the side of the electric supply part to be the same as (Vgs−Vth) in the row nearest to the termination side, Vdata should be replaced by (Vdata−$\Delta$data(y)). Here, $\Delta$data(y) corresponds to the amount of correction of a potential applied to the image signal line Lis. When Vdata in the foregoing equation (16) is replaced by (Vdata−$\Delta$Vdata(y)), the following equation (17) is obtained:

[Formula 8]

$$Vgs'(x, y) = \alpha(V\text{data} - \Delta V\text{data}(y)) + d + \Delta Vgs(y) \quad (17)$$
$$= Vgs'(x, 0) - \alpha \Delta V\text{data}(y) + \Delta Vgs(y)$$

At this time, in order to establish a relation Vgs'(x, y)=Vgs'(x, 0), a relation defined the following equation (18) may be established:

[Formula 9]

$$\Delta V\text{data}(y) = \frac{\Delta Vgs(y)}{\alpha} \quad (18)$$

Here, $\alpha$ is a writing efficiency discussed above. The replacement of Vdata by (Vdata−$\Delta$data(y)) is realized by converting a tone L' after $\gamma$ conversion to a tone (L'−La(y)). Further, a tone after $\gamma$ conversion is in proportion to Vdata. So, when a range (oscillation range) for changing the potential of the image signal line Lis is Vsig[V], and a tone after $\gamma$ conversion ranges from 0 to L'm, La(y) is expressed by the following equation (19):

[Formula 10]

$$La(y) = \frac{\Delta Vdata(y)}{Vsig}Lm' \quad (19)$$
$$= \frac{\Delta Vgs(y)}{\alpha Vsig}Lm'$$
$$= \frac{Lm'}{\alpha V sign Cs'}(-(Cs + CgsTth + CgdTd)Vs(y) + CgdTd \cdot Vd(y))$$
$$= \frac{Lm'}{\alpha VsigCs'}(-(Cs + CgsTth + CgdTd)(\Delta Vs(y) + Vs(y-1)) + CgdTd(\Delta Vd(y) + Vd(y-1)))$$
$$= \frac{Lm'}{\alpha VsigCs'}(-(Cs + CgsTth + CgdTd)\Delta Vs(y) + CgdTd \cdot \Delta Vd(y)) + La(y-1)$$

If the first term of the foregoing equation (19) is $\Delta La(y)$, the following equation (20) is established:

[Formula 11]

$$La(y) = \Delta La(y) + La(y-1) \quad (20)$$

Further, the following equation (21) is derived from the foregoing equations (9), (10), (19) and (20):

[Formula 12]

$$\Delta La(y) = \frac{Lm'}{\alpha VsigCs'}(-(Cs + CgsTth + CgdTd)\Delta Vs(y) + CgdTd \cdot \Delta Vd(y)) \quad (21)$$
$$= \frac{Lm'}{\alpha VsigCs'}(-(Cs + CgsTth + CgdTd)(-Rs \cdot I(y) + \Delta Vs(y-1)) + CgdTd(Rd \cdot I(y) + \Delta Vd(y-1)))$$
$$= \frac{Lm'}{\alpha VsigCs'}((Cs + CgsTth + CgdTd)Rs + CgdTd \cdot Rd)I(y) + \Delta La(y-1)$$

For simplification of equations, z is defined as shown in the following equation (22):

[Formula 13]

$$z = \frac{Lm'}{\alpha VsigCs'}((Cs + CgsTth + CgdTd)Rs + CgdTd \cdot Rd) \quad (22)$$

The following equation (23) is derived from the foregoing equation (21) by using the foregoing equations (8) and (22):

[Formula 14]

$$\Delta La(y) = zI(y) + \Delta La(y-1) \quad (23)$$
$$= \frac{zYr}{Lm^\gamma Er}\sum_{x=1}^{W}(Lr(x,y)^\gamma) + \frac{zYg}{Lm^\gamma Eg}\sum_{x=1}^{W}(Lg(x,y)^\gamma) +$$
$$\frac{zYb}{Lm^\gamma Eb}\sum_{x=1}^{W}(Lb(x,y)^\gamma) + \Delta La(y-1)$$

Further, Fr, Fg and Fb are defined as shown in the following equations (24) to (26). Here, Fr, Fg and Fb represent positive constants, and are obtained from known values such as wiring resistances Rs and Rd. So, Fr, Fg and Fb may be calculated in advance at the time of design of the image display device 200, and may be stored in a non-volatile memory.

[Formula 15]

$$Fr = \frac{zYr}{Lm^\gamma Er} \quad (24)$$

-continued $$Fg = \frac{zYg}{Lm^\gamma Eg} \quad (25)$$

$$Fb = \frac{zYb}{Lm^\gamma Eb} \quad (26)$$

The following equation (27) is obtained by substituting the foregoing equations (24) to (26) into the foregoing equation (23):

[Formula 16]

$$\Delta La(y) = Fr\sum_{x=1}^{W}(Lr(x,y)^\gamma) + \quad (27)$$
$$Fg\sum_{x=1}^{W}(Lg(x,y)^\gamma) + Fb\sum_{x=1}^{W}(Lb(x,y)^\gamma) + \Delta La(y-1)$$

$$La(y) = \Delta La(y) + La(y-1) \quad (28)$$

The foregoing equation (28) is given to juxtapose the foregoing equation (20) with the foregoing equation (27).

As shown in the foregoing equation (28), the correction value La(y) relating to the $y^{th}$ row is derived from the addition of $\Delta La(y)$ to the correction value La(y−1) relating to the $(y-1)^{th}$ row. As shown in the foregoing equation (27), $\Delta La(y)$ is obtained by adding a value, obtained by summing the tones of all pixels in the $y^{th}$ row that are raised to the power of γ and then multiplied by a certain factor (such as Fr, Fg and Fb), to $\Delta La(y-1)$ obtained last time relating to the $(y-1)^{th}$ row. Thus, only the correction value La(y−1) and the correction value differential ΔLa(y−1) obtained last time, and a result of calculation relating to the tones of one row are required to derive the correction value La(y) for each row.

In other words, the correction value La(y) as a second correction value is derived based on the correction value La(y−1) as a first correction value, a certain factor obtained by the wiring resistance (here, Rs and Rd) of the power source line, and tones of the plurality of pixel circuits 7 in the $y^{th}$ row. Here, the correction value La(y−1) corresponds to the potential change of the power source line (here, the VDD line Lvd and the VSS line Lvs) generated in a partial region of the image display region 210 extending from the uppermost side to the $(y-1)^{th}$ row (here, from the first row to the $(y-1)^{th}$ row). The $y^{th}$ row is arranged below the partial region (here, from the first row to the $(y-1)^{th}$ row). Further, the correction value La(y) corresponds to the potential change of the power source line generated in a partial region of the image display region 210 extending from the uppermost side to the $y^{th}$ row (here, from the first row to the $y^{th}$ row).

A region including the pixel circuits 7 in the $y^{th}$ row is identified as an $N^{th}$ light emission region (N is a natural number), and a region including the pixel circuits 7 in the $(y+1)^{th}$ row below the $y^{th}$ row is identified as an $(N+1)^{th}$ light emission region. Then, the process of deriving the correction value La(y) discussed above is alternatively expressed as follows. An $(N+1)^{th}$ correction value, corresponding to the potential change of the power source line generated in an $(N+1)^{th}$ partial region of the image display region (light emission region) 210 that extends from the uppermost side to the $(N+1)^{th}$ light emission region, is derived based on an $N^{th}$ correction value derived from the tone data of the plurality of pixel circuits 7 in an $N^{th}$ partial region of the image display region (light emission region) 210 that extends from the uppermost side to the $N^{th}$ light emission region, the wiring resistance of the power source line, and the tone data of the plurality of pixel circuits 7 in the $(N+1)^{th}$ light emission region. By way of example, the $N^{th}$ light emission region is named as a first light emission region, and the $(N+1)^{th}$ light emission region is named as a second light emission region.

Figure 25:
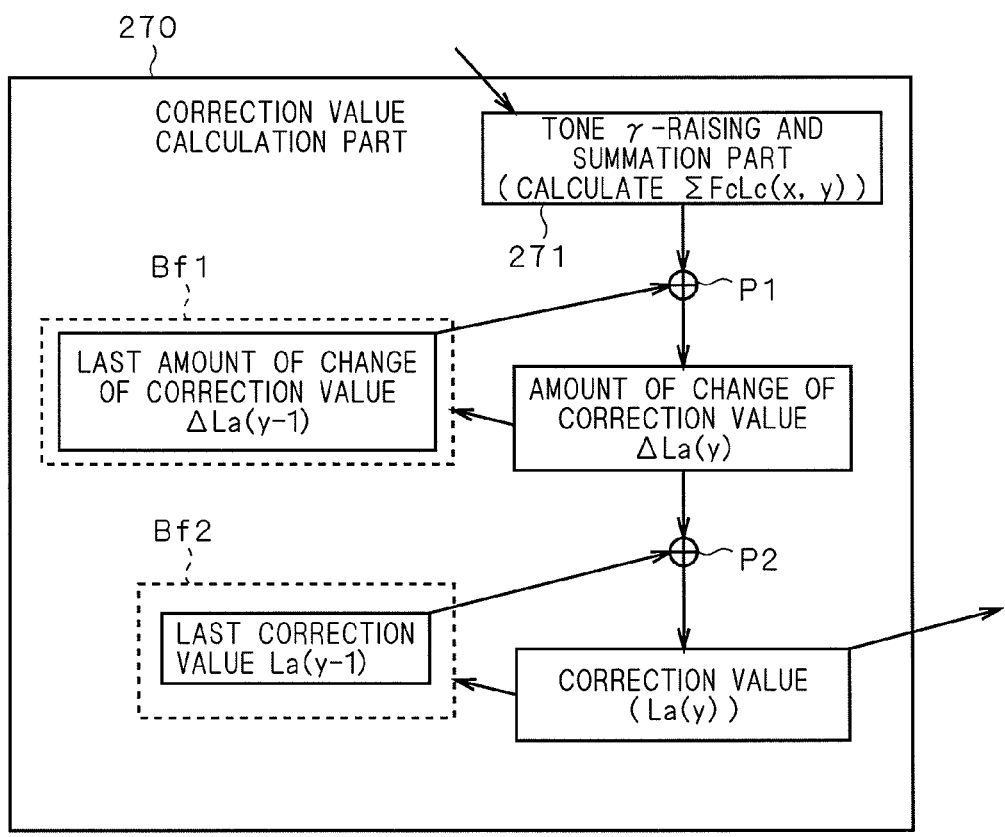
FIG. 25 is a block diagram showing a functional configuration relating to the tone processing in the image display device according to the second embodiment of the present invention.

FIG. 25 is a functional block diagram showing the process of deriving a correction value at the correction value calculation part 270 as a calculation part. Here, the process of obtaining a correction value from the tone in the $y^{th}$ row is discussed.

The correction value calculation part 270 has a tone γ-raising and summation part 271, a first buffer Bf1, a second buffer Bf2, a first adder P1, and a second adder P2.

The tone γ-raising and summation part 271 gives a value (hereinafter referred to as "ΣFcLc(x, y)", c is any one of r, g and b) obtained by summing the first term to the third term of the foregoing equation (27), namely by summing the tones of all pixels in the $y^{th}$ row that are raised to the power of γ, and then multiplied by a certain factor (such as Fr, Fg and Fb).

The first buffer Bf1 is constituted by a memory and the like, and temporarily stores therein the amount of change ΔLa(y−1) of a correction value derived last time. When a relation y=1 is established, namely when a correction value is to be obtained from the tone in the first row, no amount of change of a correction value derived last time is provided. So, a relation ΔLa(y−1)=ΔLa(0)=0 is established.

The first adder P1 adds the amount of change ΔLa(y−1) of a correction value stored in the first buffer Bf1 to ΣFcLc(x, y) obtained in the tone γ-raising and summation part 271, thereby deriving the amount of change ΔLa(y) of a correction value. The amount of change ΔLa(y) of a correction value derived at this time is stored in the first buffer Bf1 to be used to obtain a correction value from the tone in the next row. Namely, the amount of change of a correction value stored in the first buffer Bf1 is always updated to the latest one.

The second buffer Bf2 is constituted by a memory and the like, and temporarily stores therein the correction value La(y−1) derived last time. When a relation y=1 is established, namely when a correction value is to be obtained from the tone in the first row, no correction value derived last time is provided. So, a relation La(y−1)=La(0)=0 is established.

The second adder P2 adds the correction value La(y−1) stored in the second buffer Bf2 to the amount of change ΔLa(y) of a correction value derived in the first adder P1, thereby deriving the correction value La(y). The correction value La(y) derived at this time is stored in the second buffer Bf2 to be used to obtain a correction value from the tone in the next row. Namely, a correction value stored in the second buffer Bf2 is always updated to the latest one.

The discussion continues turning back to FIG. 24.

A subtractor M1 subtracts a correction value for each row derived in the correction value calculation part 270 from each of the red tone data 250R, the green tone data 250G and the blue tone data 250B that are tone data in each row after γ conversion. As a result, red tone data 251R, green tone data 251G and blue tone data 251B are generated.

Here, a correction value for correcting the influence of voltage drop is derived from tone data before γ conversion from the first row to the $N^{th}$ row (N is a natural number). Tone data in the $(N+1)^{th}$ row after γ conversion is corrected by using this correction value. Namely, tone data in the $(N+1)^{th}$ row after γ conversion is obtained that is corrected based on tone data contained in image data and a correction value.

An image signal line control IC 290 as a potential application part controls the potential of the image signal line Lis during writing process based on the red tone data 251R, the green tone data 251G and the blue tone data 251B. As an example, a potential based on a correction value derived from tone data from the first row to the $N^{th}$ row and tone data in the $(N+1)^{th}$ row, is applied to the image signal line Lis. Then, writing process follows in which electric charge is accumulated in the capacitors 4 of the plurality of pixel circuits 7 in the $(N+1)^{th}$ row arranged below a light emission region extending from the first row to the $N^{th}$ row. At this time, the potentials of the plurality of pixel circuits 7 in the $(N+1)^{th}$ row are set.

An increased potential calculation part 280 derives a value (compensation value) for compensating for the overall reduction of tones caused by subtracting a correction value derived for each row in the correction value calculation part 270 from the red tone data 250R, the green tone data 250G and the blue tone data 250B after γ conversion.

Here, by the correction value calculation part 270, the tone of each pixel after γ conversion is lower by a maximum correction value than each ideal tone after γ conversion corresponding to each tone of image data, leading to the reduction in brightness level of an image as a whole if nothing is done. Next, this problem and means of solving the same are discussed.

Potentials do not change uniformly in the VDD lines Lvd and the VSS lines Lvs of all pixel circuits 7 in the image display region 210 shown in FIG. 21. A maximum potential change is generated in the VDD lines Lvd and the VSS lines Lvs of the pixel circuits 7 nearest to the termination side (in the −Y direction) in the image display region 210 shown in FIG. 21. Thus, each tone data is corrected by the subtractor M1 with respect to the row nearest to the termination side (in the −Y direction) in the image display region 210 shown in FIG. 21.

When h rows of pixel circuits are arranged in the image display region 210, for example, a correction value to be derived from tone data before γ conversion from the first row to the $(h-1)^{th}$ row is derived last as a maximum correction value. This correction value derived last (hereinafter also referred to as "ultimate correction value") is used to correct tone data in the $h^{th}$ row. Namely, the tone of each pixel after γ conversion is lowered by the maximum and ultimate correction value by making correction using potential change and a correction value.

Accordingly, by the reduction of each tone after γ conversion by a correction value, the brightness level of light emission of the image display region 210 as a whole is reduced if nothing is done, while trouble of irregularity in brightness level resulting from potential change generated by the wiring resistance of the power source line is suppressed.

In response, in order to compensate for such reduction of a tone, the increased potential calculation part 280 derives a compensation value for increasing a potential applied to the gate 2g of the driving transistor 2 during light emission, namely for increasing the gate voltage Vgs of the driving transistor 2. Of correction values for all rows sequentially derived in the correction value calculation part 270, the increased potential calculation part 280 derives a compensation value from a correction value (ultimate correction value) 271F in the last row, namely the lowermost row of the image display region 210.

As a way to increase the gate voltage Vgs of the driving transistor 2, a potential applied to the image signal line Lis during light emission may be increased, for example. Thus, a compensation value may be such that it increases a potential applied to the image signal line Lis during light emission. In the below, a compensation value is assumed to be a value for increasing a potential applied to the image signal line Lis during light emission.

In the pixel circuit 7 shown in FIG. 13 and others, when a potential to be applied to the image signal line Lis is increased by v[V], the amount of change (the amount of increase) Vup of the gate voltage Vgs of the driving transistor 2 is expressed by the following equation (29):

$$Vup = (Cs/Cs') \times v \tag{29}$$

Accordingly, a compensation value applied to the case where a tone after γ conversion is lowered by La(h) by the ultimate correction value 271F may be such that it raises a tone in proportion to the potential of the image signal line Lis during light emission by $\alpha \times (Cs'/Cs) \times La(h)$.

In the light emission period P6, the image signal line control IC 290 applies a potential to which a potential corresponding to a compensation value is added to the image signal line Lis.

In the image signal line control IC 290, a potential applied to the image signal line Lis is increased by a compensation value in response to a correction value corresponding to the potential changes of the VDD line Lvd and the VSS line Lvs generated in the image display region 210, namely in response to an ultimate correction value derived from the tone data of the plurality of pixel circuits 7 arranged throughout the image display region 210. At this time, a potential applied to the gate 2g is increased in response to the ultimate correction value. Thus, the potential of the image signal line during electric charge accumulation is corrected to thereby avoid trouble of reduction in brightness level of light emission.

In the image signal line control circuit IC 290, when one tone is obtained according to a predetermined rule indicative of the relation between tones and potentials, a potential corresponding uniquely to this tone is applied to the image signal line Lis.

As discussed above, when a compensation value for canceling tone correction in the lowermost row, namely the row nearest to the side of the electric supply part is applied to the image signal line control IC 290 during light emission, no tone correction is effected in the lowermost row, while a tone lowered by potential change is raised to a greater extent as a distance to the uppermost (termination) side becomes shorter.

In the light emission period P6, the driving IC as a controller adjusts potentials applied to the VDD line Lvd and the VSS line Lvs to cause the organic EL elements 1 to emit light. That is, the driving IC supplies currents to the VDD line Lvd and the VSS line Lvs, by which the driving IC serves as a controller for causing the organic EL elements 1 to emit light.

Figure 26:
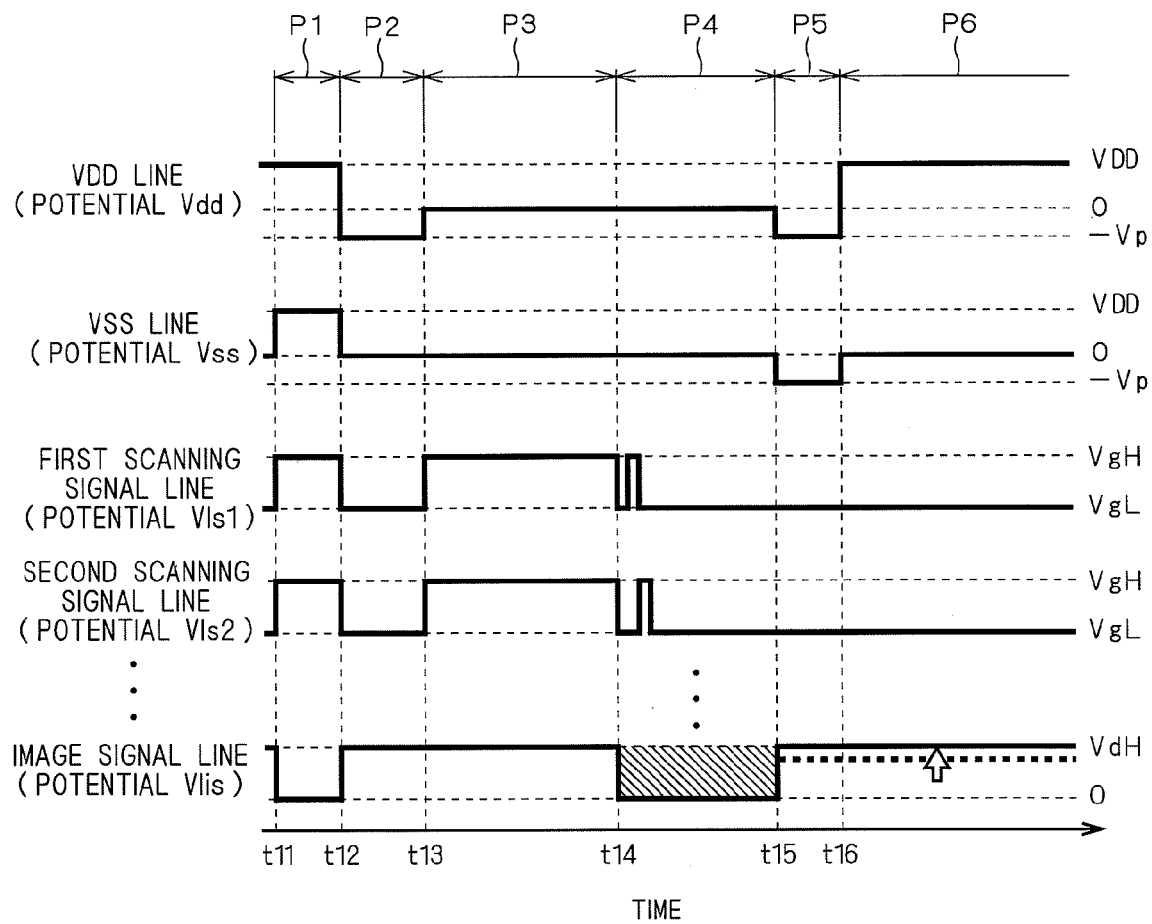
FIG. 26 is a timing chart showing driving waveforms in the display part according to the second embodiment of the present invention.

FIG. 26 is a timing chart showing driving waveforms in the display part 200a when a potential applied to the image signal line Lis during light emission is increased. In the timing chart shown in FIG. 26, a potential applied to the image signal line Lis in the element initialization period P5 (from time t15 to time t16) and in the light emission period P6 (time t16 and thereafter) is increased with respect to the timing chart shown in FIG. 15.

As discussed above, in the image display device 200 of the second embodiment, a correction value is derived for each row from tone data, and tone data after γ conversion is corrected by the correction value. Thus, trouble of irregularity in brightness level is suppressed to improve image quality. Further, a next correction value is obtained by using a correction value derived last time. So, a correction value for each region is determined in a relatively short period of time, thereby shortening processing time from the acquisition of image data to light emission.

Further, the gate voltage Vgs of the driving transistor 2 is increased during light emission to avoid trouble of reduction in brightness level of light emission, this trouble is produced by correction of the potential of the image signal line Lis during electric charge accumulation.

<6. Modifications>

The present invention is not limited to the embodiments discussed above. Various modifications, variations and the like may be devised without departing from the scope of the invention.

⊚ By way of example, in the second embodiment discussed above, a correction value derived from tone data in the $N^{th}$ row is used to correct tone data in the $(N+1)^{th}$ row, which is not the only example. As an example, a correction value derived from tone data in the $N^{th}$ row may be used to correct the tone data in the $N^{th}$ row. A correction value derived from tone data in the $N^{th}$ row may also be used to correct tone data in the $(N+2)^{th}$ row and its subsequent rows. That is, a correction value derived from tone data in the $N^{th}$ row may be used to correct the tone data in the $N^{th}$ row, or in any one of rows subsequent to the $N^{th}$ row. In other words, a potential based on a correction value obtained from tone data in the $N^{th}$ row, and the tone data in the $N^{th}$ row or in any one of rows subsequent to the $N^{th}$ row, may be applied to the image signal line Lis to accumulate electric charge into a plurality of pixel circuits constituting the $N^{th}$ row, or any one of rows subsequent to the $N^{th}$ row.

However, using a correction value derived from tone data in the $N^{th}$ row to correct the tone data in the $N^{th}$ row or in any one of rows subsequent to the $(N+1)^{th}$ row results in a higher degree of accuracy of correction. Meanwhile, using a correction value derived from tone data in the $N^{th}$ row to correct tone data in the $(N+1)^{th}$ row and its subsequent rows results in the advantage that calculation speed for obtaining a correction value may be slow.

⊚ In the second embodiment discussed above, tone data is corrected for each row based on a correction value to reduce a potential applied to the image signal line Lis during writing process, which is not the only example. As an example, a power source voltage applied to the image signal line control IC 290 may be reduced based on a correction value to thereby reduce a potential applied to the image signal line Lis during writing process. As a way to change a power source voltage applied to the image signal line control IC 290, a transformer such as a DC-DC converter may be used. The adoption of this structure achieves the same effect as that of the second embodiment discussed above. However, the correction of tone data based on a correction value as in the foregoing second embodiment suppresses trouble of irregularity in brightness level with a simpler structure.

⊚ In the second embodiment discussed above, the tone -raising and summation part 271 of the correction value calculation part 270 sequentially calculates a value obtained by summing the tones of all pixels in the $y^{th}$ row that are raised to the power of γ and then multiplied by a certain factor (such as Fr, Fg and Fb), which is not the only example. By way of example, a data table may be prepared in which the relation between tones, and a value obtained by summing the tones that are raised to the power of γ and then multiplied by a certain factor (such as Fr, Fg and Fb), is stored. Then, a value corresponding to the tone of each pixel may be retrieved from the data table.

Figure 27:
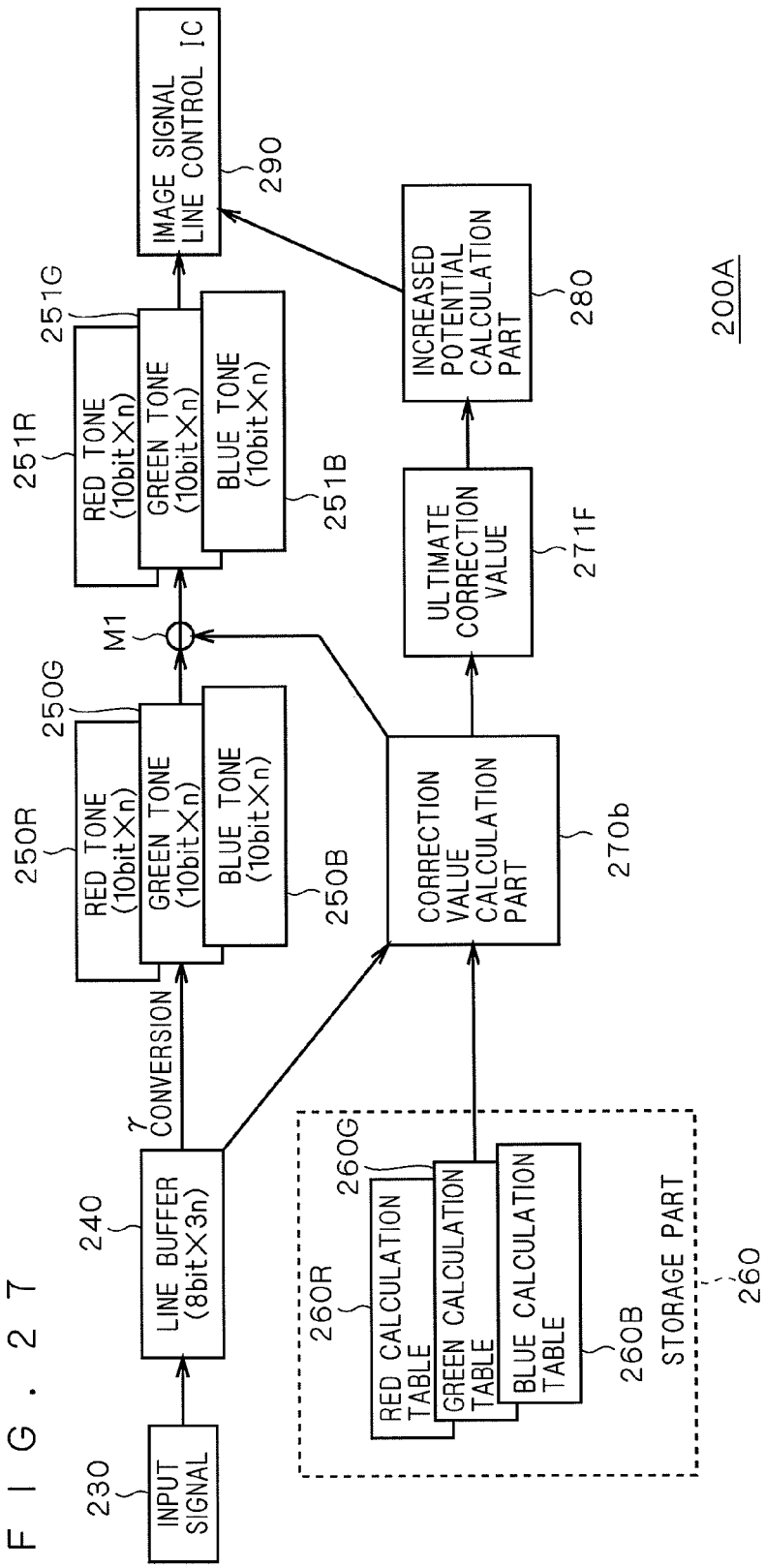
FIG. 27 is a block diagram showing a functional configuration relating to tone processing according to a third embodiment of the present invention.
Figure 28:
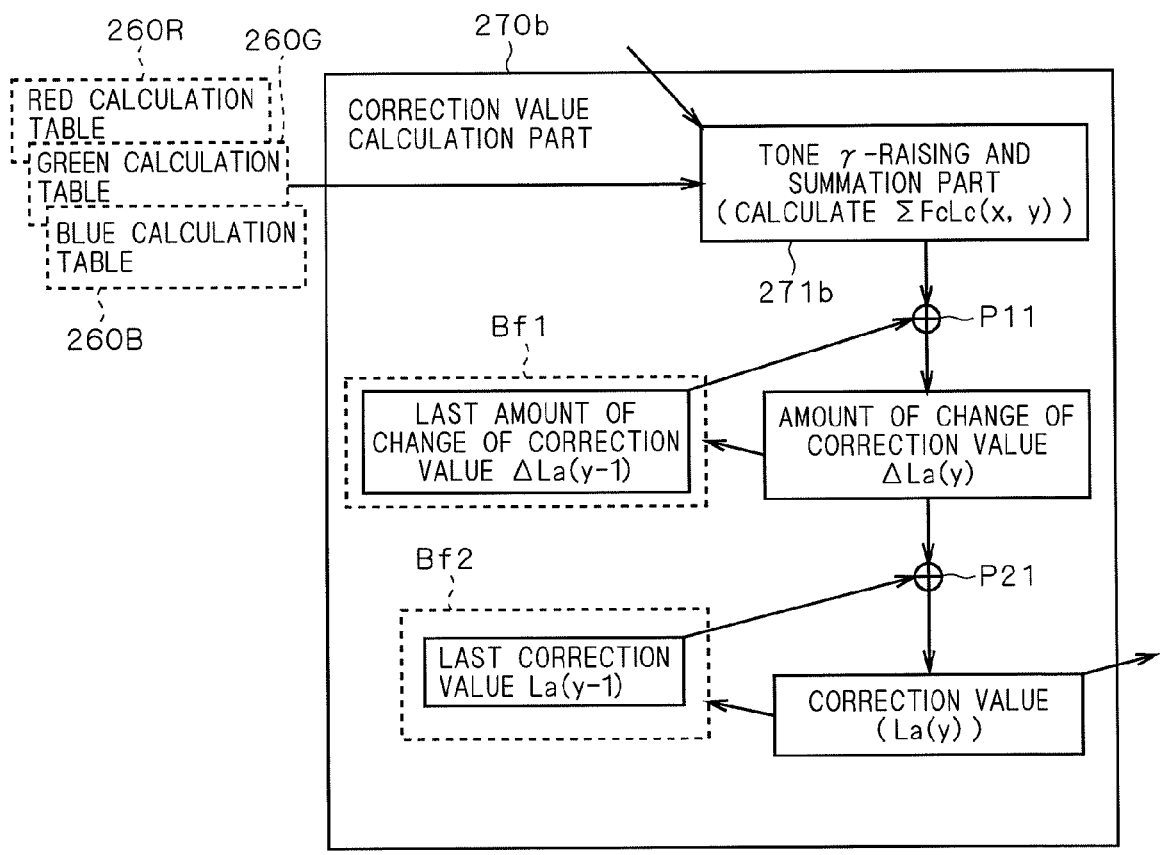
FIG. 28 is a block diagram showing a functional configuration relating to the tone processing according to the third embodiment of the present invention.

FIGS. 27 and 28 are block diagrams showing a functional configuration relating to tone processing in an image display device 200A according to a third embodiment of the present invention.

Compared to the functional block diagrams shown in FIGS. 24 and 25, a storage part 260 containing a red calculation table 260R, a green calculation table 260G and a blue calculation table 260B is added to the functional block diagrams shown in FIGS. 27 and 28. Further, the tone γ-raising and summation part 271 and the correction value calculation part 270 are changed to a tone γ-raising and summation part 271b and a correction value calculation part 270b.

More specifically, the storage part 260 is formed for example from a hard disk and the like. The red calculation table 260R is a data table in which the relation between tones of R pixels, and a value obtained by summing the tones that are raised to the power of γ and then multiplied by a certain factor Fr, is given in list form. The green calculation table 260G is a data table in which the relation between tones of G pixels, and a value obtained by summing the tones that are raised to the power of γ and then multiplied by a certain factor Fg, is given in list form. The blue calculation table 260B is a data table in which the relation between tones of B pixels, and a value obtained by summing the tones that are raised to the power of γ and then multiplied by a certain factor Fb, is given in list form. When the tone data of R, G and B pixels are obtained, the tone γ-raising and summation part 271b makes reference to the red, green and blue calculation tables 260R, 260G and 260B where appropriate to provide a value obtained by summing the tones that are raised to the power of γ and then multiplied by a certain factor (such as Fr, Fg and Fb).

In the second embodiment discussed above, a potential applied to the image signal line Lis during light emission is increased to increase the gate voltage Vgs of the driving transistor 2, which is not the only example. As an example, a potential applied to the VDD line Lvd may be increased by the driving IC during light emission in response to a correction value derived from the tone data of the plurality of pixel circuits 7 arranged throughout the light emission region, thereby increasing the gate potential, namely the gate voltage Vgs of the driving transistor 2. Here, when a potential applied to the VDD line Lvd is increased, the increase in potential of the VDD line Lvd acts on the parasitic capacitance CgdTd between the first and third electrodes of the driving transistor 2, thereby realizing the increase of the gate potential, namely the gate voltage Vgs of the driving transistor 2.

Figure 29:
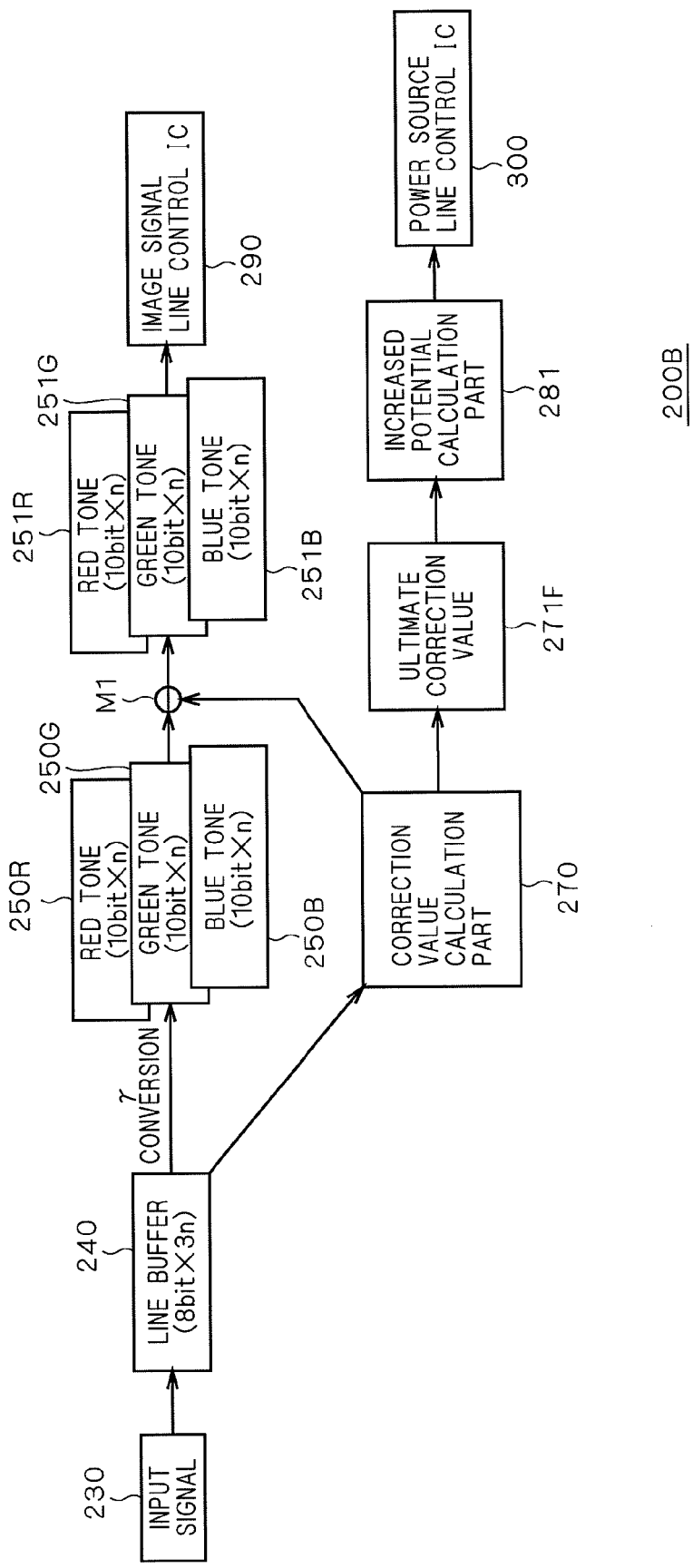
FIG. 29 is a block diagram showing a functional configuration relating to tone processing according to a fourth embodiment of the present invention.

FIG. 29 is a block diagram showing a functional configuration relating to tone processing in an image display device 200B according to a mode for increasing the gate voltage Vgs during light emission by increasing a potential applied to the VDD line Lvd, namely according to a fourth embodiment of the present invention. Here, an increased potential calculation part 281 calculates an increment of a potential applied to the VDD line Lvd as a compensation value from the ultimate correction value 271F. Then, a power source line control IC 300 increases a potential applied to the VDD line Lvd based on the compensation value. Thus, like in the second embodiment discussed above, no tone correction is effected in the lowermost row, while a tone lowered by potential change is raised to a greater extent as a distance to the uppermost (termination) side becomes shorter.

Figure 30:
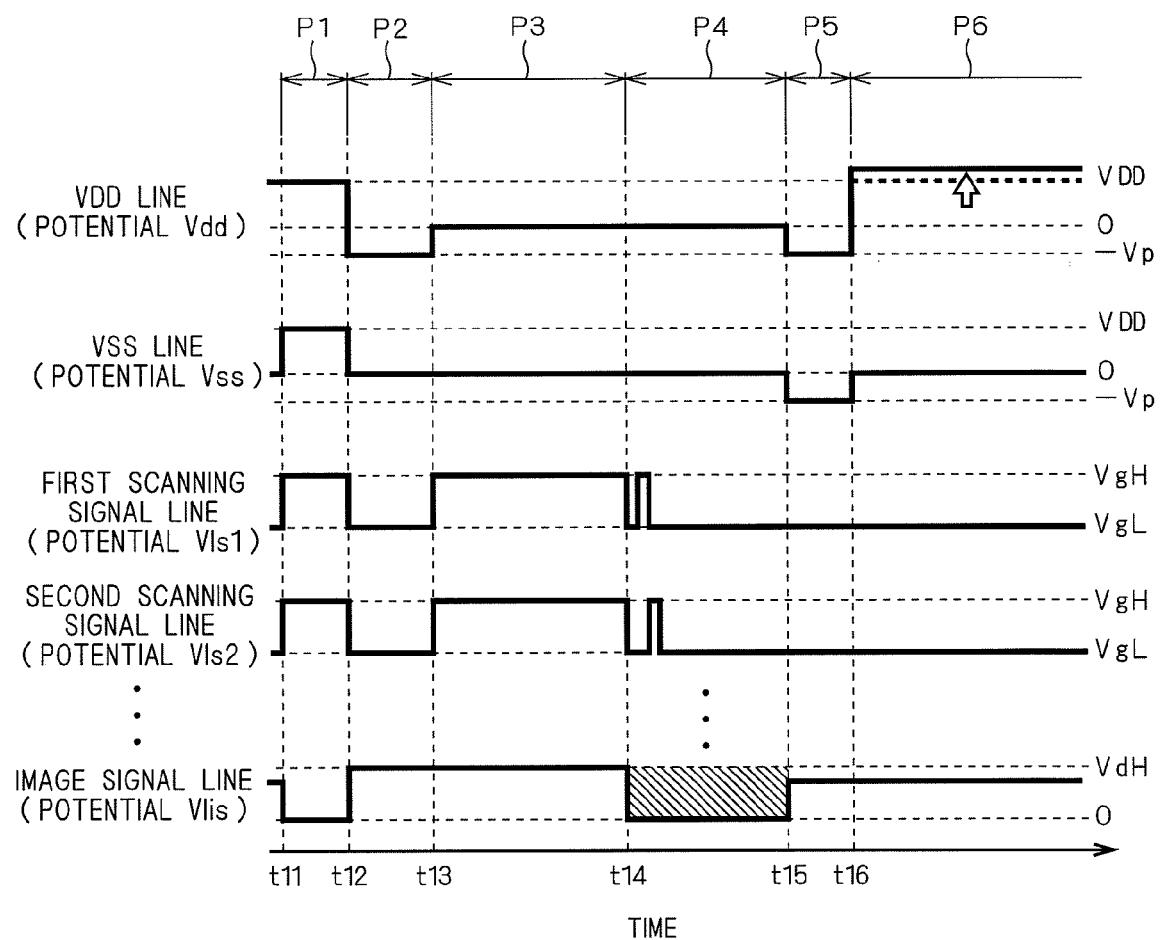
FIG. 30 is a timing chart showing driving waveforms in a display part according to the fourth embodiment of the present invention

FIG. 30 is a timing chart showing driving waveforms in a display part of the image display device 200B according to a mode for increasing a potential applied to the VDD line Lvd during light emission, namely according to the fourth embodiment of the present invention. In the timing chart shown in FIG. 30, a potential applied to the VDD line Lvd in the element initialization period PS (from time t15 to time t16) and in the light emission period P6 (time t16 and thereafter) is increased with respect to the flowchart shown in FIG. 15.

⊚ In the second embodiment discussed above, a correction value is calculated from the tones of all pixels in each row, which is not the only example. By way of example, the tone of one pixel is sampled every predetermined number of pixels (every two pixels, for example), and this tone may be used to calculate a correction value. Namely, based on the tone data of some of pixel circuits included in a light emission region of each row, the wiring resistance of a power source line, and a correction value obtained last time, a next correction value may be derived. The calculation of a correction value with pixel skipping results in a smaller correction value if nothing is done. So, it is preferable to obtain a correction value by suitably performing multiplication by a skipping rate. This structure reduces the amount of tone data used for the calculation, so the amount of calculation is reduced, leading to speedup in deriving a correction value.

However, when a correction value is derived from the tone data of all pixels, and a corrected potential is applied to the image signal line Lis to accumulate electric charge into the pixel circuit 7 as in the second preferred embodiment discussed above, trouble of irregularity in brightness level caused by the wiring resistance of the power source line is suppressed with a higher degree of accuracy.

⊚ In the second embodiment discussed above, a correction value is calculated for each line of pixels formed from a plurality of pixel circuits adjacent to each other, which is not the only example. By way of example, a correction value may be calculated from tone data every predetermined number of rows, such as every two to five rows, for example. Namely, based on the tone data of some of pixel circuits included in a light emission region formed from the predetermined number of rows, the wiring resistance of a power source line, and a correction value obtained last time, a next correction value may be derived. Regarding a row the tone data of which was not used for the calculation of a correction value, a correction value for this row may be obtained by interpolation operation such as interpolation. The same correction value may be used for the predetermined number of rows, and a correction value may be changed every predetermined number of rows. This structure reduces the amount of tone data used for the calculation, so the amount of calculation is reduced, leading to speedup in deriving a correction value.

However, when a correction value is derived for each line of pixels, and a corrected potential is applied to the image signal line Lis to accumulate electric charge into the pixel circuit 7 as in the second preferred embodiment discussed above, trouble of irregularity in brightness level caused by the wiring resistance of a power source line is suppressed with a higher degree of accuracy.

⊚ In the second embodiment discussed above, a correction value is obtained from tones before γ conversion, which is not the only example. A correction value may be obtained from tone data after γ conversion. However, regarding the relation between tones after γ conversion and a potential applied to the image signal line Lis, a tone zero does not necessarily correspond to a potential 0 V, requiring complicated calculation. In contrast, when a correction value is obtained from tones before γ conversion as in the second embodiment discussed above, a correction value is obtained by summing tones that are raised to the power of 2.2 and then multiplied by a proportionality factor. Thus, a correction value is preferably obtained from tones before γ conversion as in the foregoing second preferred embodiment, in terms of easily calculating a correction value with a high degree of accuracy.

⊚ When the potential change of the power source line from the electric supply part to the last row on the side of the electric supply part (h$^{th}$ row, for example) is unignorably large, this change may be taken into account when the gate voltage Vgs is increased during light emission.

⊚ In the second preferred embodiment discussed above, the correction value La(y) is simply subtracted from tone in each row, which is not the only example. When the writing efficiency α differs among R, G and B pixels, La(y) may be multiplied by fixed factors that are different among R, G and B pixels, for example.

The invention claimed is:

1. A method of driving an image display device including a plurality of pixel circuits each having a light emitting element; a power source line connected in common to the plurality of pixel circuits, supplying a current from one end side toward an opposite end side of a light emission region in which the plurality of pixel circuits are arranged; and an image signal line for applying a potential corresponding to image data to the plurality of pixel circuits, the method comprising:
   a deriving step of deriving a second correction value based on a first correction value derived from tone data of the plurality of pixel circuits included in a first light emission region extending halfway from the opposite end side to the one end side of the light emission region, a resistance of the power source line, and tone data of the plurality of pixel circuits included in a second light emission region arranged closer to the one end side than the first light emission region;
   an adjusting step of adjusting a tone indicated by the image data based on the second correction value;
   a setting step of setting a potential of the plurality of pixel circuits arranged in the second light emission region or a potential of the plurality of pixel circuits arranged closer to the one end side than the second light emission region by applying a potential corresponding to the tone adjusted in the adjusting step to the image signal line; and
   a light emission step of causing each of the light emitting elements to emit light by supplying a current from the power source line to each of the light emitting elements,
   wherein the first light emission region is an N$^{th}$ light emission region (N is a natural number) extending halfway from the opposite end side to the one end side of the light emission region and the second light emission region is an (N+1)$^{th}$ light emission region arranged closer to the one end side than the N$^{th}$ light emission region, and
   the first correction value is N$^{th}$ correction value derived from tone data of the plurality of pixel circuits that are included in the N$^{th}$ light emission region and the second correction value is (N+1)$^{th}$ correction value derived based on the N$^{th}$ correction value, the resistance of the power source line, and tone data of the plurality of pixel circuits included in the (N+1)$^{th}$ light emission region.

2. The method of driving an image display device according to claim 1, wherein the first and second light emission regions are adjacent to each other and each constituted by pixel circuits arranged in a line of the plurality of pixel circuits.

3. The method of driving an image display device according to claim 1, wherein in the deriving step, the second correction value is derived based on the first correction value, the resistance of the power source line, and tone data of a part of pixel circuits included in the second light emission region.

4. The method of driving an image display device according to claim 1, wherein each of the pixel circuits includes a driving transistor having a first electrode, a second electrode and a third electrode, and the driving transistor adjusts a current flowing between the first electrode and the second electrode by a potential applied to the third electrode, the second electrode is electrically connected to the light emitting element, and a current flowing between the first electrode and the second electrode is adjusted to control a current flowing in the light emitting element, and
   in the light emission step, a potential applied to the third electrode is adjusted in response to a correction value derived from tone data of the plurality of pixel circuits arranged throughout the light emission region.

5. The method of driving an image display device according to claim 4, wherein in the light emission step, a potential applied to the image signal line is increased in response to a correction value derived from tone data of the plurality of pixel circuits arranged throughout the light emission region to increase a potential applied to the third electrode.

6. The method of driving an image display device according to claim 4, wherein the power source line is electrically connected to the first electrode, and in the light emission step, a potential applied to the power source line is increased in response to a correction value derived from tone data of the plurality of pixel circuits arranged throughout the light emission region to increase a potential applied to the third electrode.

7. An image display device, comprising:
   a plurality of pixel circuits each having a light emitting element;
   a power source line connected in common to the plurality of pixel circuits, and supplying a current from one end side toward an opposite end side of a light emission region in which the plurality of pixel circuits are arranged;
   an image signal line for applying a potential corresponding to image data to the plurality of pixel circuits;
   a calculation part for deriving a second correction value based on a first correction value derived from tone data of the plurality of pixel circuits included in a first light emission region extending halfway from the opposite end side to the one end side of the light emission region, a resistance of the power source line, and tone data of the plurality of pixel circuits included in a second light emission region arranged closer to the one end side than the first light emission region;
   an adjustment part for adjusting a tone indicated by the image data based on the second correction value;
   a potential application part for setting a potential of the plurality of pixel circuits arranged in the second light emission region or a potential of the plurality of pixel circuits arranged closer to the one end side than the second light emission region by applying a potential corresponding to the tone adjusted by the adjustment part to the image signal line; and
   a control part for causing each of the light emitting elements to emit light by supplying a current from the power source line to each of the light emitting elements,
   wherein the first light emission region is an N$^{th}$ light emission region (N is a natural number) extending halfway from the opposite end side to the one end side of the light emission region and the second light emission region is an (N+1)$^{th}$ light emission region arranged closer to the one end side than the N$^{th}$ light emission region, and
   the first correction value is N$^{th}$ correction value derived from tone data of the plurality of pixel circuits that are included in the N$^{th}$ light emission region and the second correction value is (N+1)$^{th}$ correction value derived based on the N$^{th}$ correction value, the resistance of the power source line, and tone data of the plurality of pixel circuits included in the (N+1)$^{th}$ light emission region.

* * * * *